(12) United States Patent
Jin

(10) Patent No.: US 12,260,793 B2
(45) Date of Patent: Mar. 25, 2025

(54) DISPLAY PANEL, ELECTRONIC DEVICE AND CRACK DETECTION METHOD

(71) Applicant: WUHAN TIANMA MICROELECTRONICS CO., LTD., Wuhan (CN)

(72) Inventor: Chunming Jin, Wuhan (CN)

(73) Assignee: WUHAN TIANMA MICROELECTRONICS CO., LTD., Wuhan (CN)

( * ) Notice: Subject to any disclaimer, the term of this patent is extended or adjusted under 35 U.S.C. 154(b) by 200 days.

(21) Appl. No.: 18/323,421

(22) Filed: May 25, 2023

(65) Prior Publication Data

US 2023/0298497 A1 Sep. 21, 2023

(30) Foreign Application Priority Data

Mar. 1, 2023 (CN) .......................... 202310190039.3

(51) Int. Cl.
*G09G 3/00* (2006.01)
*H10K 59/131* (2023.01)

(52) U.S. Cl.
CPC ........... *G09G 3/006* (2013.01); *H10K 59/131* (2023.02); *G09G 2330/12* (2013.01)

(58) Field of Classification Search
CPC ............... G09G 3/006; G09G 2330/12; G09G 2300/0413; G09G 3/3208; G09G 3/36; H10K 59/131; H10K 71/70
USPC ......................................... 324/537, 500, 515
See application file for complete search history.

(56) References Cited

U.S. PATENT DOCUMENTS

| 11,250,764 | B2 * | 2/2022 | Sun ...................... G09G 3/2096 |
| 2020/0294456 | A1 * | 9/2020 | Wang ...................... G09G 3/36 |
| 2022/0139292 | A1 * | 5/2022 | Baek .................... G09G 3/2092 345/55 |

FOREIGN PATENT DOCUMENTS

CN 112885844 A 6/2021

* cited by examiner

*Primary Examiner* — Giovanni Astacio-Oquendo
(74) *Attorney, Agent, or Firm* — KILPATRICK TOWNSEND & STOCKTON LLP

(57) ABSTRACT

A display panel, an electronic device and a crack detection method are provided. The display panel includes: a substrate and a detection signal line located on a side of the substrate, where the detection signal line is located in the non-display area, and includes a first detection signal line and a second detection signal line arranged in sequence in a first direction, and when detecting cracks, the first detection signal line and the second detection signal line may be used to detect cracks in different manners or in the same manner, to improve the reliability of crack detection. In addition, one of the first detection signal line and the second detection signal line may be selected for crack detection according to the actual situation, to improve the efficiency of crack detection.

17 Claims, 20 Drawing Sheets

DISPLAY PANEL, ELECTRONIC DEVICE AND CRACK DETECTION METHOD

This application claims priority to Chinese Patent Application No. 202310190039.3, titled "DISPLAY PANEL, ELECTRONIC DEVICE AND CRACK DETECTION METHOD", filed on Mar. 1, 2023 with the China National Intellectual Property Administration, which is hereby incorporated by reference in its entirety.

FIELD

The present disclosure relates to the field of display panels, and particularly, to a display panel, an electronic device including a display panel, and a crack detection method for a display panel.

BACKGROUND

With the continuous development of display technologies, the application fields of display panels are increasingly wide. The current mainstream display panel is manufactured on a motherboard and then obtained by cutting the motherboard. However, the cutting process may cause cracks on the manufactured display panel, and the cracks may develop as the display panel is used, which has a negative impact on the service life of the display panel. Hence, crack detection is usually required during the manufacturing process of the display panel, to improve the yield and service life of the display panel.

In the conventional technology, the crack detection of the display panel is performed by arranging detection signal lines in a frame area, i.e., a non-display area of the display panel to detect cracks. However, currently, the arrangement of detection signal lines in the display panel occupies a large space, resulting in a larger frame size of the display panel, which is not in line with the development trend of narrow frames.

SUMMARY

In view of this, a display panel, an electronic device including the display panel, and a crack detection method for a display panel are provided according to the present disclosure.

A display panel is provided according to the present disclosure, which includes: a substrate, a detection signal line located on a side of the substrate, a display area and a non-display area surrounding the display area, and an inorganic layer. The detection signal line is located in the non-display area, and includes a first detection signal line and a second detection signal line arranged in sequence in a first direction. The inorganic layer is located between a layer on which the first detection signal line is located and a layer on which the second detection signal line is located. The first detection signal line and the second detection signal line are at least partially overlapped in the first direction, where the first direction is perpendicular to a plane where the substrate is located.

An electronic device is provided according to the present disclosure. The electronic device includes the above display panel.

A crack detection method is provided according to the present disclosure. The crack detection method is applicable to the above display panel, and includes: providing an input signal to at least one of the first detection signal line and the second detection signal line to acquire a crack detection signal; and determining whether there is a crack on the display panel according to the crack detection signal.

BRIEF DESCRIPTION OF THE DRAWINGS

The embodiments of the present disclosure are described in the drawings used in the description of the embodiments are briefly introduced hereinafter. It is apparent that the drawings in the following description illustrate only embodiments of the present disclosure.

The structures, proportions, sizes and the like shown in the drawings of this specification are only used to cooperate with the content disclosed in the specification, for those who are familiar with this technology to understand and read, which are not used to limit the conditions that can be implemented in the present disclosure and has no technical substantive significance. Any modification of the structure, change of the proportional relationship or adjustment of the size shall still fall within the scope that the technology content disclosed in the present disclosure without affecting the effect and purpose of the present disclosure.

DETAILED DESCRIPTION OF EMBODIMENTS

The embodiments of the present disclosure will be described clearly and completely hereinafter in combination with the drawings in the embodiments of the present disclosure. It is apparent that the described embodiments are only part of the embodiments of the present disclosure, rather than all of the embodiments.

In order to make the embodiments of the present disclosure more clear and comprehensible, the present disclosure will be further described in detail below in conjunction with the drawings and embodiments.

Figure 1:
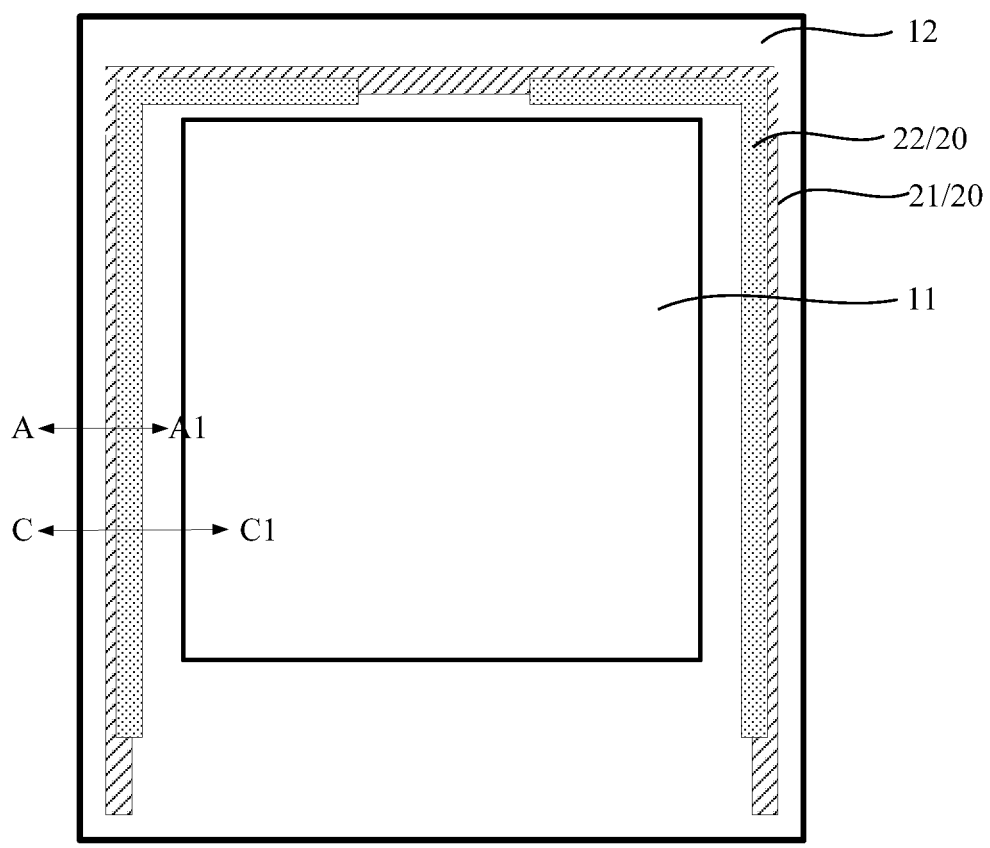
FIG. 1 is a schematic structural diagram of a display panel according to an embodiment of the present disclosure.
Figure 2:
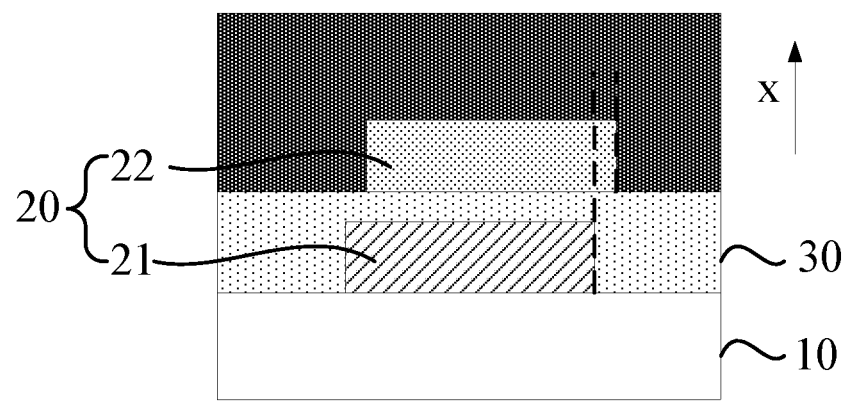
FIG. 2 is a cross-sectional diagram taken along AA1 in FIG. 1.

Based on this, referring to FIG. 1 and FIG. 2, FIG. 2 is a cross-sectional diagram taken along AA1 in FIG. 1, where the cross-sectional diagram of FIG. 2 shows only a substrate 10, a first detection signal line 21 and a second detection signal line 22 and an inorganic layer 30 between the first detection signal line 21 and the second detection signal line 22, while other film layers are not shown. According to the present disclosure, a display panel is provided, which includes:

a substrate 10;
a detection signal line 20 located on a side of the substrate 10;
a display area 11 and a non-display area 12 surrounding the display area 11; and
an inorganic layer.

The detection signal line 20 is located in the non-display area 12, and includes a first detection signal line 21 and a second detection signal line 22 arranged in sequence in a first direction x. The first detection signal line 21 and the second detection signal line 22 are configured to detect a crack in the display panel. It should be noted that, in the embodiment of the present disclosure, the first detection signal line 21 and the second detection signal line 22 are both made from metal Mo, which is not limited in the present disclosure and may be determined according to circumstances.

The inorganic layer is located between the film layer where the first detection signal line 21 is located and the film layer where the second detection signal line 22 is located. The inorganic layer 30 is configured to insulate and isolate the film layer where the first detection signal line 21 is located from the film layer where the second detection signal line 22 is located.

Figure 3:
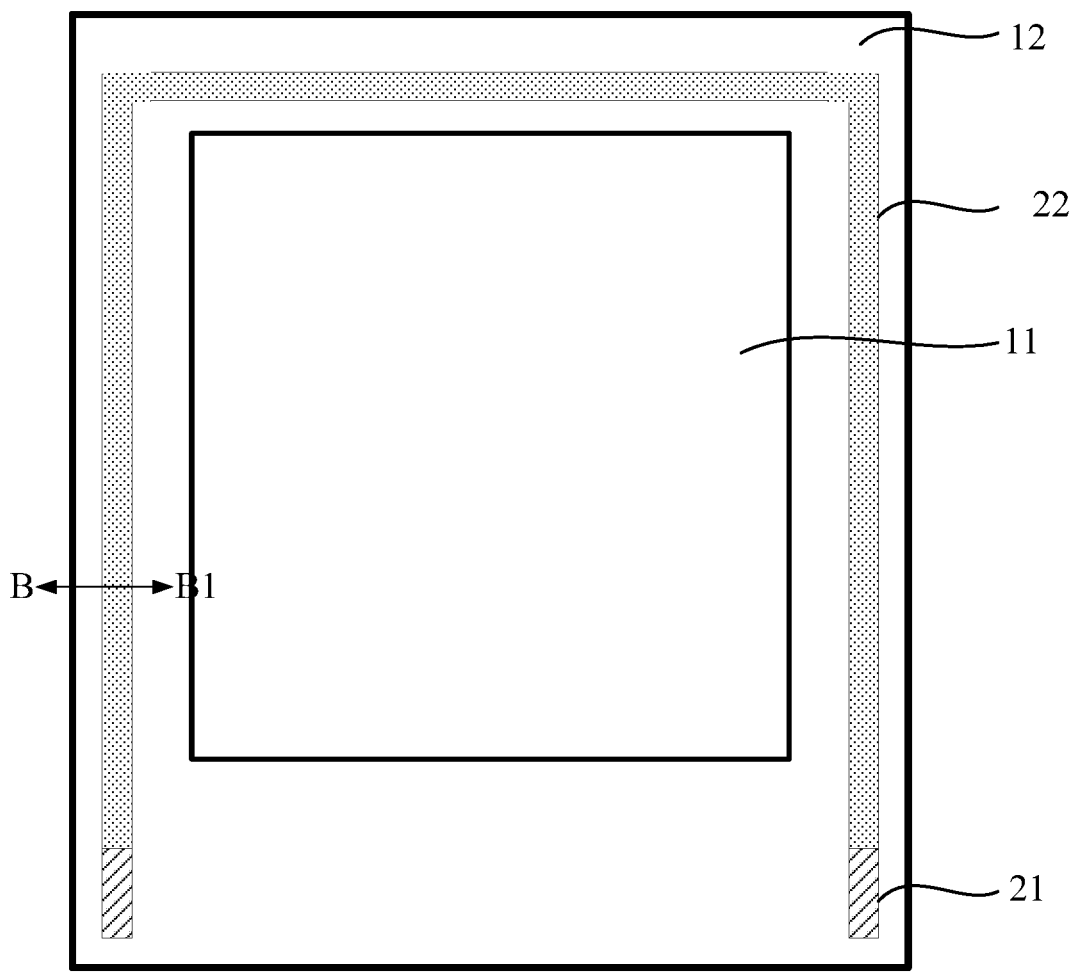
FIG. 3 is a schematic structural diagram of a display panel according to another embodiment of the present disclosure.
Figure 4:
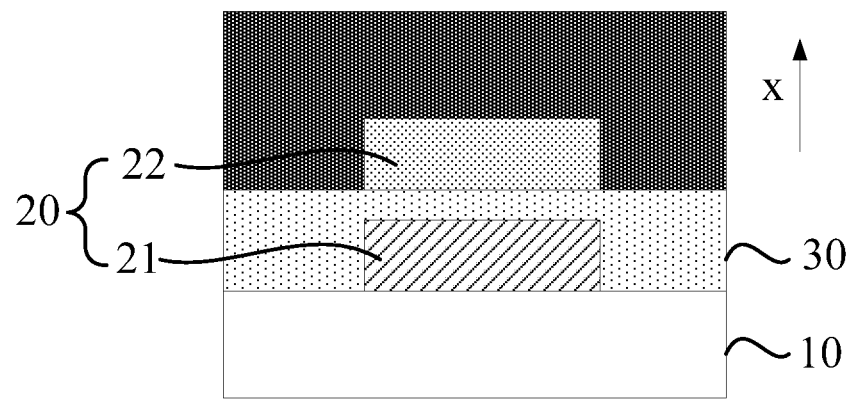
FIG. 4 is a cross-sectional diagram taken along BB1 in FIG. 3.

In the first direction x, the first detection signal line 21 and the second detection signal line 22 are at least partially overlapped, that is, the orthographic projection of the first detection signal line 21 on a side of the substrate 10 and that of the second detection signal line 22 one the side of the substrate 10 are at least partially overlapped. In other words, the orthographic projection of the first detection signal line 21 on the substrate 10 and that of the second detection signal line 22 on the substrate 10 are partially overlapped, as shown in FIG. 1 and FIG. 2. In one embodiment, the orthographic projections of the first detection signal line 21 and the second detection signal line 22 on the substrate 10 are completely overlapped, as shown in FIG. 3 and FIG. 4. FIG. 3 is a schematic structural diagram of a display panel according to another embodiment of the present disclosure. FIG. 4 is a cross-sectional diagram taken along BB1 in FIG. 3. It should be noted that the first detection signal line 21 and the second detection signal line 22 being at least partially overlapped refers to parts where the first signal detection line 21 and the second signal detection line 22 extend in the same path being at least partially overlapped in the first direction x.

The first direction x is perpendicular to the plane where the substrate 10 is located.

In an embodiment of the present disclosure, the display panel includes the first detection signal line 21 and the second detection signal line 22 located in the non-display area 12. When detecting a crack in the display panel, the first detection signal line 21 and the second detection signal line 22 may detect the crack in the display panel in different manners. In one embodiment, the first detection signal line 21 and the second detection signal line 22 may detect the crack in the same manner, to improve the reliability of crack detection. In addition, in a case that it is not required to use both the first detection signal line and the second detection signal line for crack detection, one of the first and second detection signal lines 22 may be selected for crack detection according to the actual situation, to improve the efficiency of crack detection.

In addition, in the display panel, the first detection signal line 21 and the second detection signal line 22 are sequentially arranged in the first direction x, that is, the first detection signal line 21 and the second detection signal line 22 are sequentially arranged on one side of the substrate 10 in the direction perpendicular to the substrate. In addition, in the first direction x, the projections of the first detection signal line 21 and the second detection signal line 22 are at least partially overlapped, that is, the projections of the first detection signal line 21 and the second detection signal line the signal line 22 are partially or completely overlapped. Therefore, the crack detection lines of the display panel according to the embodiment of the present disclosure occupies smaller space in the horizontal direction, and the space occupied by the crack detection lines in the non-display area 12, i.e., the frame area can be effectively reduced, which is beneficial to reduce the size of the frame area of the display panel, and facilitates the realization of a design with a narrow frame, which is in line with the development trend of a display panel with a narrow frame.

Figure 5:
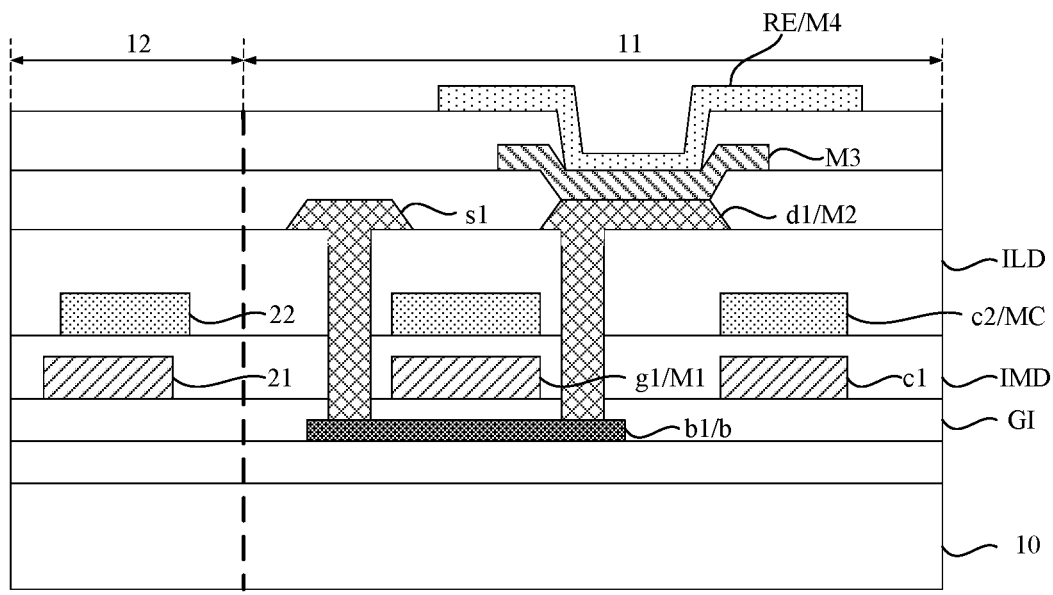
FIG. 5 is a cross-sectional diagram taken along CC1 in FIG. 1.

On the basis of the above embodiments, in an embodiment of the present disclosure, as shown in FIG. 5, which is a cross-sectional diagram taken along CC1 in FIG. 1, the display panel includes a gate metal layer g1, and a capacitor metal layer c2, where the capacitor metal layer c2 is located on a side of the gate metal layer g1 away from the substrate 10, the first detection signal line 21 is on the same layer as the gate metal layer g1, and the second detection signal line 22 is on the same layer as the capacitor metal layer c2, and the first detection signal line 21 and the gate metal layer g1 in the display panel can be manufactured in the same process step. In an embodiment, the first detection signal line 21 and the gate metal layer g1 may be manufactured by patterning the metal layer where the first detection signal line 21 and the gate metal layer g1 are located. Similarly, the second detection signal line 22 may be manufactured in the same process step as the capacitor metal layer c2, which is beneficial to simplify the manufacturing process of the display panel.

Taking an OLED display panel as an example, as shown in FIG. 5, the display panel, from bottom to top, includes: a substrate 10, an active layer b, a first metal layer M1, a second metal layer MC, a third metal layer M2, a fourth metal layer M3, a fifth metal layer M4, and insulating layers between the semiconductor layer b1 and the first metal layer M1 and adjacent metal layers. In an embodiment, the first insulating layer GI is located between the active layer b and the first metal layer M1, the second insulating layer IMD is located between the first metal layer M1 and the second metal layer MC, the interlayer dielectric layer ILD is located between the second metal layer MC and the third metal layer M2, etc., the second insulating layer IMD is equivalent to the inorganic layer 30 in FIG. 2.

It should be noted that the above metal layers are patterned metal layers, which may be used to form various components in the display panel. The first metal layer M1 includes the gate metal layer g1 and the lower plate c1 of a storage capacitor Cst that are located in the display area 11 and the first detection signal line 21 located in the non-display area 12. The second metal layer MC includes the upper plate c2 of the storage capacitor Cst located in the display area 11 and the second detection signal line 22 located in the non-display area 12, where the upper plate c2 of the storage capacitor Cst is located on the side of the gate metal layer g1 away from the substrate 10, and is also referred to as the capacitor metal layer. The third metal layer M2 includes a source metal layer s1 and a drain metal layer d1 that are located in the display area. The fifth metal layer M4 includes an anode RE of an OLED light-emitting element located in the display area 11, the fifth metal layer M4 is electrically connected to the third metal layer M2 through the fourth metal layer M3.

It can be known from the above that, in the display panel, the first detection signal line 21 is on the same layer as the gate metal layer g1, and the second detection signal line 22 is on the same layer as the storage capacitor metal layer c2. In other words, the first detection signal line 21 and the gate metal layer g1 belong to the same conductive layer, and the second detection signal line 22 and the upper plate c2 of the storage capacitor belong to the same conductive layer. The conductive layer where the gate metal layer g1 is located and the conductive layer where the storage capacitor metal layer c2 is located have small thickness, which may be 2700 angstroms, and are subject to great stress. Therefore, the first detection signal line 21 being in the same conductive layer as the gate metal layer g1, and the second detection signal line 22 and the upper plate c2 of the storage capacitor being in the same conductive layer cause great stress on the first detection signal line 21 and the second detection signal line 22, resulting in improved crack detection effect. In contrast, other film layers have greater thickness, and better ductility and strong crack resistance, which may reduce the crack detection effect. Hence, in the display panel according to the present disclosure, the first detection signal line 21 is on the same layer as the gate metal layer g1, and the second detection signal line 22 is on the same layer as the storage capacitor metal layer c2.

It should be noted that, in FIG. 5, an OLED display panel is used as an example for illustration. However, the embodiments of the present disclosure is also applicable to an LCD display panel. The first detection signal line 21 and the second signal line detection line 22 may be prepared by using metal layers in the LCD panel that are similar to the above metal layers of the OLED display panel, without an additional metal layer, the details of which will not be described in detail in the embodiments of the present disclosure.

Figure 6:
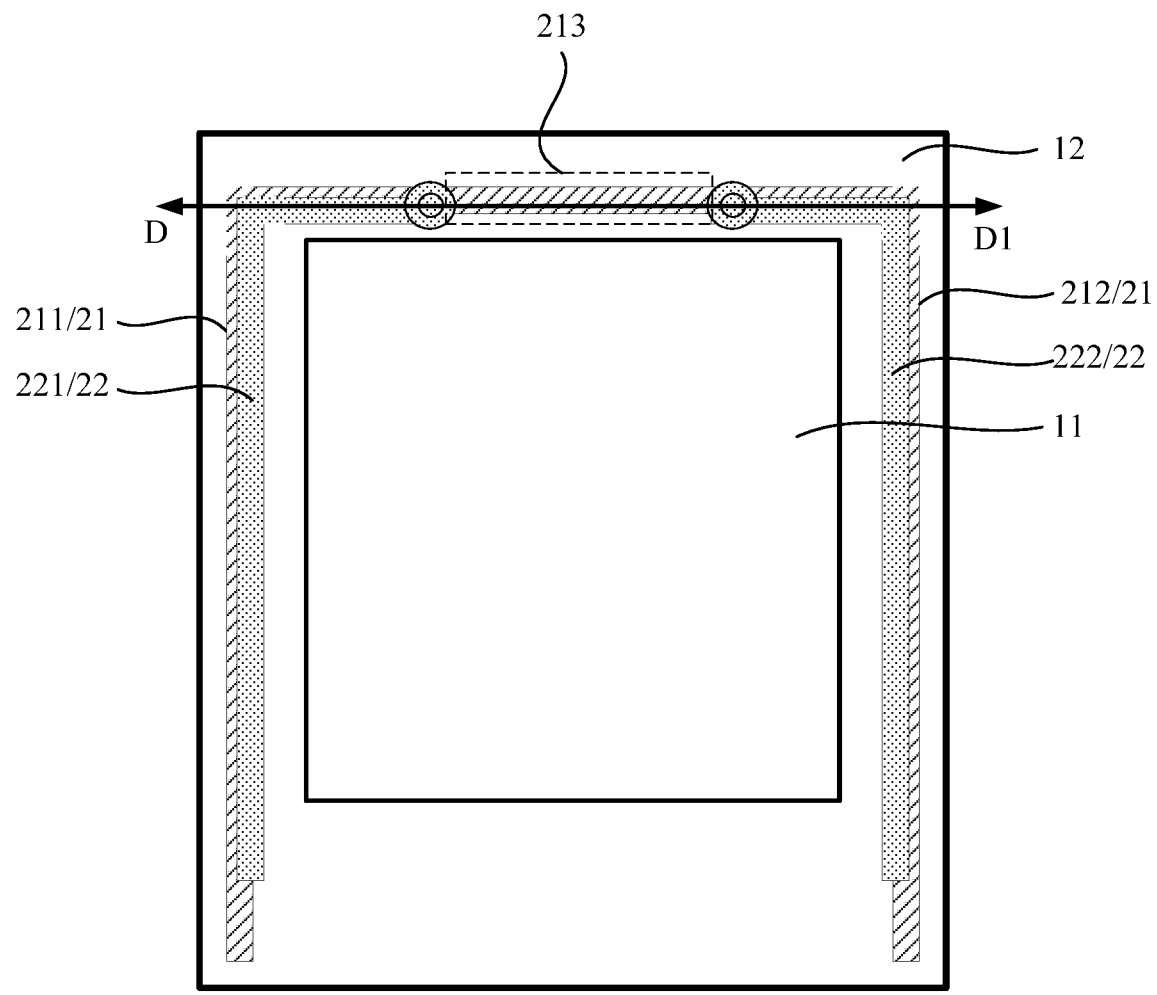
FIG. 6 is a schematic structural diagram of a display panel according to yet another embodiment of the present disclosure.

On the basis of the above-mentioned embodiments, in an embodiment of the present disclosure, referring to FIG. 6, which is a schematic structural diagram of a display panel according to an embodiment of the present disclosure, the first detection signal line 21 includes a first signal line 211 and a second signal line 212 located on opposite sides of the display area 11 respectively, and the second detection signal line 22 includes a third signal line 221 and a fourth signal line 222 located on the two opposite sides of the display area 11 respectively. In the first direction, the first signal line 211 and the third signal line 221 are at least partially overlapped, and the second signal line 212 and the fourth signal line 222 are at least partially overlapped, which is beneficial to reduce the size of the frame area of the display panel and facilitate the realization of a design with a narrow frame.

Further referring to FIG. 6, the detection signal line further includes a fifth signal line 213, where the first signal line 211 is electrically connected to the second signal line 212 through the fifth signal line 213, and the third signal line 221 is electrically connected to the fourth signal line 222 via the fifth signal line 222. The fifth signal line 213 is located in the non-display area 12, and is on the same layer as the first detection signal line 21, that is, the fifth signal line 213, the first signal line 211 and the second signal line 212 belong to the same conductive layer, and two terminals of the fifth signal line 213 are electrically connected to the third signal line 221 and the fourth signal line 222 respectively.

Figure 7:
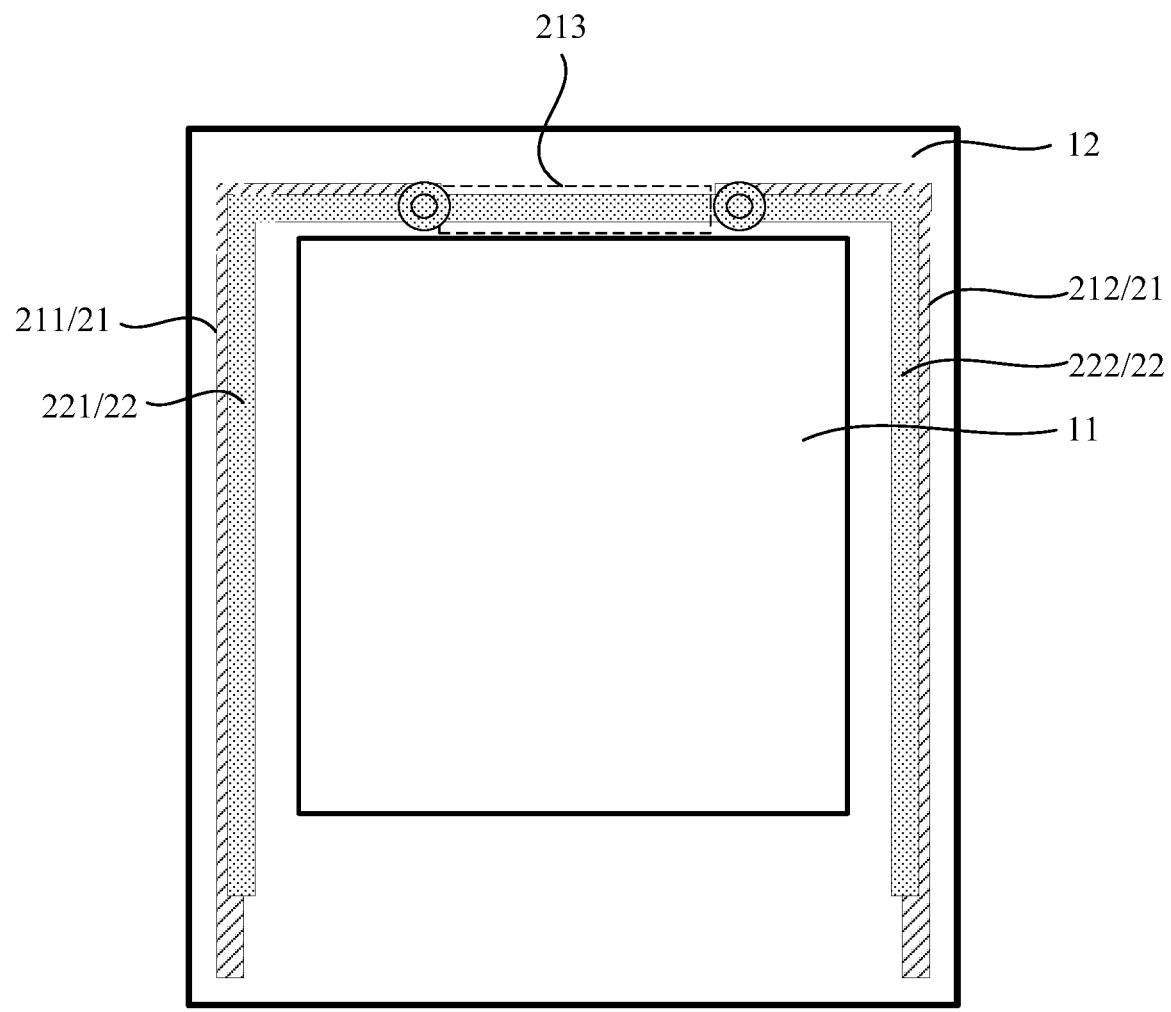
FIG. 7 is a schematic structural diagram of a display panel according to yet another embodiment of the present disclosure.

Reference is made to FIG. 7, which is a schematic structural diagram of a display panel according to the present disclosure. The display panel shown in FIG. 7 differs from the display panel described with reference to FIG. 6 in that, the fifth signal line 213 and the second detection signal line 22 are located on the same layer, that is, the fifth signal line 213 belongs to the same conductive layer as the third signal line 221 and the fourth signal line 222, and the two terminals of the fifth signal line 213 are electrically connected to the first signal line 211 and the second signal line 212 respectively.

As described above, since the first detection signal line 21 is electrically connected to the second detection signal line 22 through the fifth signal line 213, the first detection signal line 21 may perform crack detection independently, or may collaborate with the second detection signal line 22 for detecting cracks.

In an embodiment, the first detection signal line 21 is used as the signal input line for the second detection signal line 22. For example, the first detection signal line 21 provides an input signal to the second detection signal line 22 during crack detection, and the second detection signal line 22 does not require a specified signal input line. As a result, the first detection signal line 21 and the second detection signal line 22 can be arranged at different layers in the vertical direction, to further reduce the space occupied by the crack detection lines, and further reduce the size of the frame area of the display panel, which contributes to the development trend of the narrow frame of the display panel. In addition, since the first detection signal line 21 is used as the signal input line for the second detection signal line 22, it is not necessary to provide a separate signal input line for the second detection signal line 22, which simplifies the structure of the second signal detection line 22, to simplify the structure of the display panel.

Figure 8:
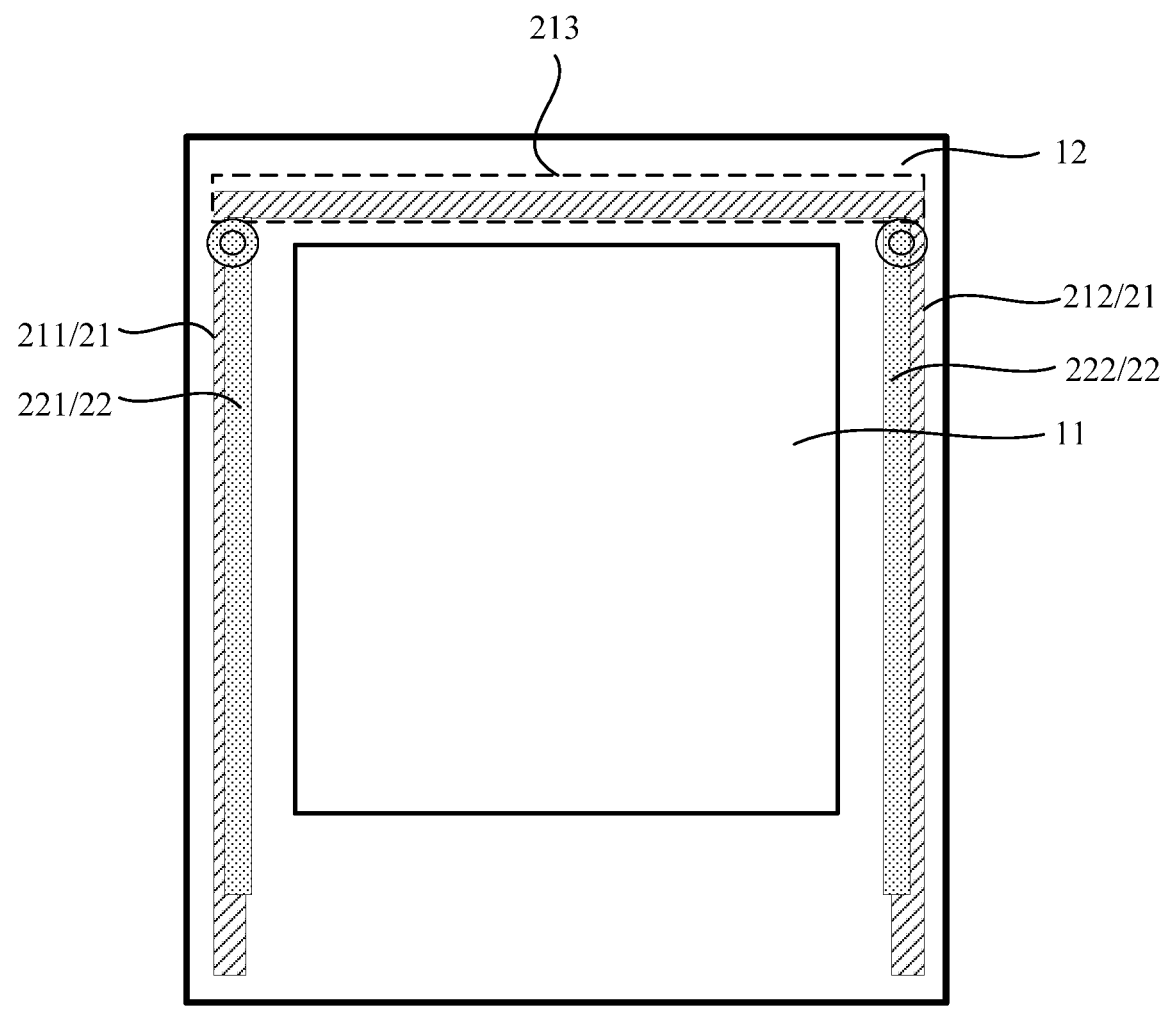
FIG. 8 is a schematic structural diagram of a display panel according to yet another embodiment of the present disclosure.
Figure 9:
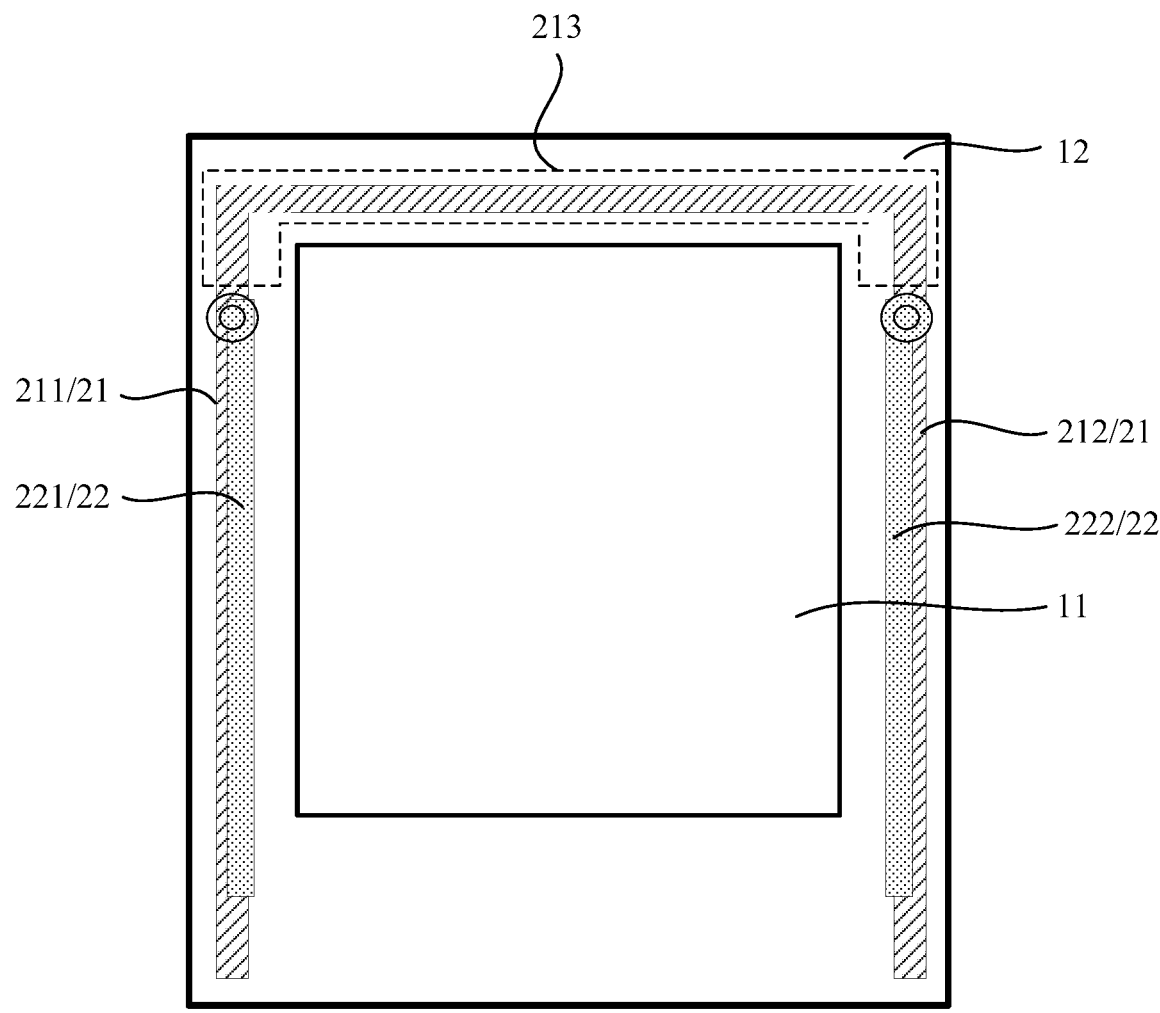
FIG. 9 is a schematic structural diagram of a display panel according to yet another embodiment of the present disclosure.

It should be noted that, in the above embodiment, as shown in FIG. 6, the first signal line 211 and the second signal line 212 are located on opposite sides of the display area 11 respectively, extend to the side where the fifth signal line 213 is located, and are electrically connected to the two terminals of the fifth signal line 213 respectively. Nevertheless, it is determined according to specific circumstance rather than being limited in the present disclosure. In another embodiment of the present disclosure, as shown in FIG. 8, which is a schematic structural diagram of a display panel according to the present disclosure, the first signal line 211 and the second signal line 212 are located on opposite sides of the display area 11 respectively, where the first signal line 211 extends to a connection portion between the side where the first signal line 211 is located and the side where the third signal line 213 is located, and the second signal line 212 extends to a connection portion between the side where the second signal line 212 is located and the side where the third signal line 213 is located, but the first signal line 211 and the second signal line 212 do not extend to the side where the fifth signal line 213 is located, and are electrically connected to the fifth signal line 213. As shown in FIG. 9, which is a schematic structural diagram of a display panel according to the present disclosure, the first signal line 211 and the second signal line 212 are located on opposite sides of the display area 11 respectively, and the two terminals of the fifth signal line 213 are extended to the side where the first signal line 211 is located and the side where the second signal line 212 is located and are electrically connected to the first signal line 211 and the second signal line 212, respectively.

On the basis of the above embodiments, in an embodiment of the present disclosure, in a case that the fifth signal line 213 and the first detection signal line 21 belong to the same conductive layer, the fifth signal line 213 and the first detection signal line 21 may be obtained by patterning the conductive layer where the fifth signal line 213 and the first detection signal line 21 are located, and then electrically connecting the two terminals of the fifth signal line 213 to the third signal line 221 and the fourth signal line 222 that are located on a different layer from the fifth signal line 213 respectively. In an embodiment, the two terminals of the fifth signal line 213 are electrically connected to the third signal line 221 and the fourth signal line 222 through via holes or transistors, respectively, where the transistors include diodes and thin-film transistors.

Figure 10:
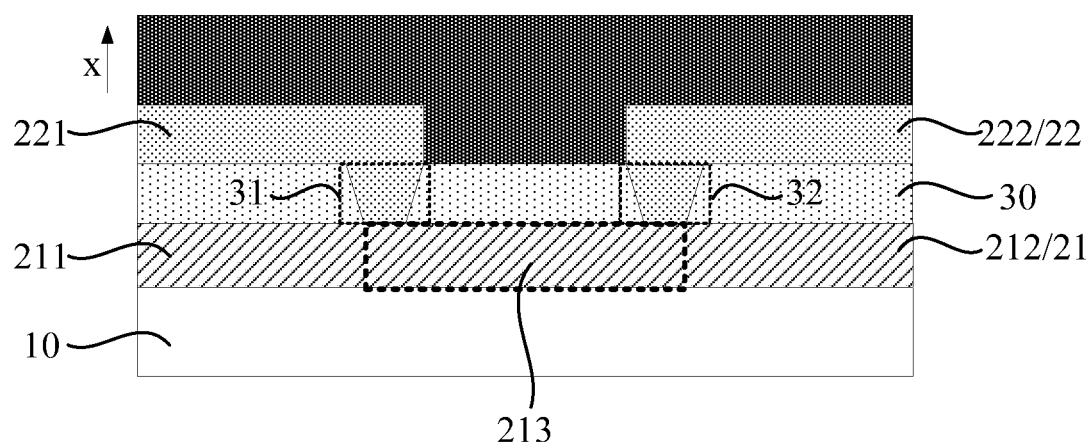
FIG. 10 is a cross-sectional diagram taken along DD1 in FIG. 6.

Reference is made to FIG. 10, which is a cross-sectional diagram taken along DD1 in FIG. 6. In FIG. 10, only relevant film layers are shown, including: the substrate 10, the first signal line 211, the second signal line 212, the third signal line 221, the fourth signal line 222, the fifth signal line 213, and the inorganic layer 30. The display panel further includes: a first via hole 31 and a second via hole 32, where two terminals of the first via hole 31 are connected to the fifth signal line 213 and the third signal line 221 respectively, and the two terminals of the second via hole 32 are connected to the fifth signal line 213 and the fourth signal line 222 respectively, and the two terminals of the fifth signal line 213 are electrically connected to the third signal line 221 and the fourth signal line 222 respectively, to enable the first detection signal line 21 to be electrically connected to the second detection signal line 22, and to provide a signal input to the second detection signal line 22. The display panel realizes the electrical connection between the first signal line 211 and the third signal line 221, and the electrical connection between the second signal line 221 and the fourth signal line 222 through the conductive via hole. In other words, display panel realizes the electrical connection between the first detection signal line 21 and the second detection signal line 22 in a simple connection manner, which is beneficial to simplify the manufacturing process of the display panel.

Figure 11:
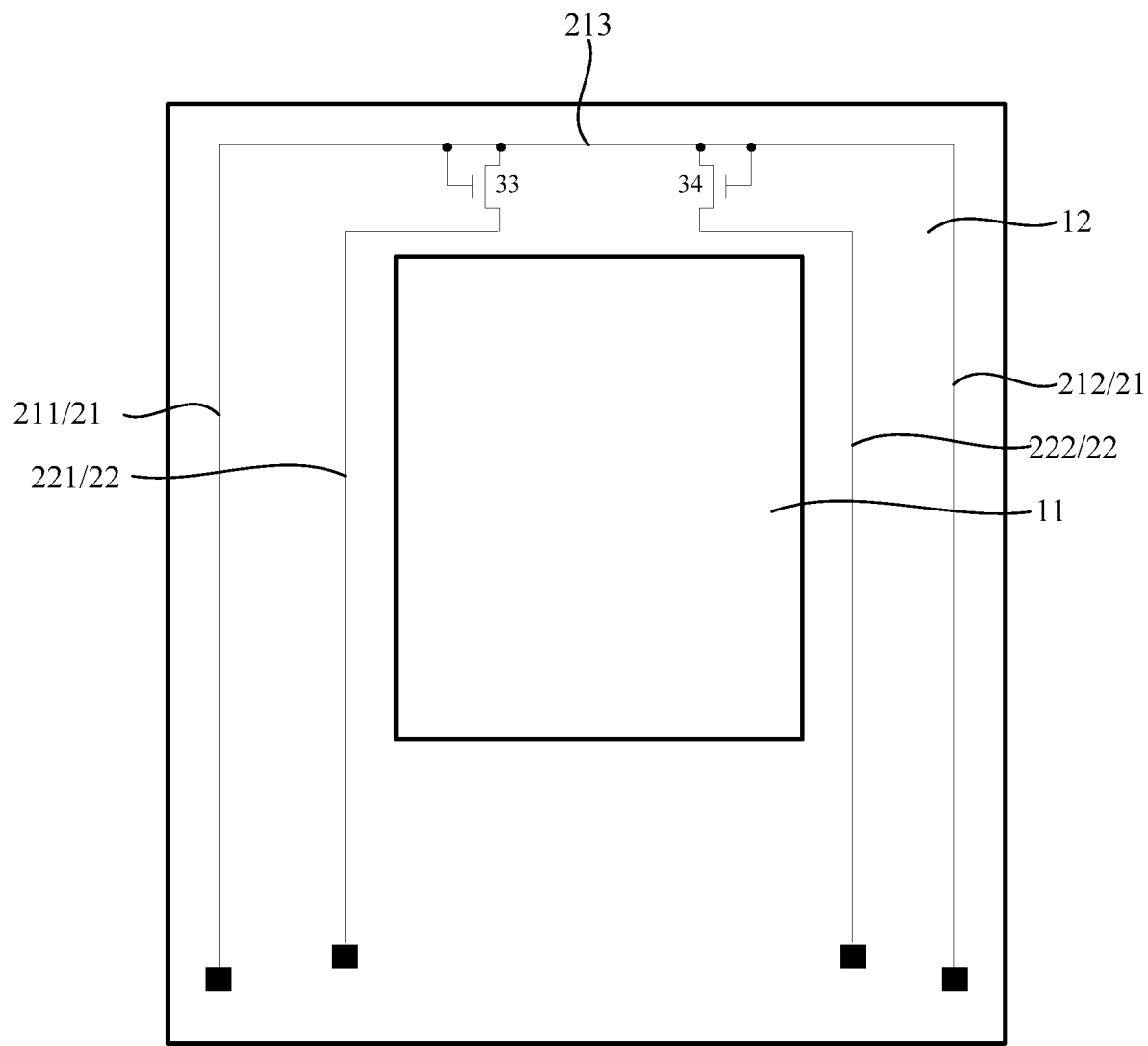
FIG. 11 is a schematic structural diagram of a display panel according to yet another embodiment of the present disclosure.

As shown in FIG. 11, which is a schematic structural diagram of a display panel according to the present disclosure, the display panel includes a first thin-film transistor 33 and a second thin-film transistor 34. A source of the first thin-film transistor 33 is electrically connected to a gate of the first thin-film transistor 33, and is further electrically connected to the fifth signal line 213, while the drain of the first thin-film transistor 33 is electrically connected to one terminal of the third signal line 221. A source of the second thin-film transistor 34 is electrically connected to a gate of the second thin-film transistor 34, and is further electrically connected to the fifth signal line 213, while the drain of the second thin-film transistor 34 is electrically connected to the fourth signal line 222, and the two terminals of the fifth signal line 213 are electrically connected to the third signal line 221 and the fourth signal line 222 respectively. In this way, the first detection signal line 21 is may provide an input signal to the second detection signal line 22. In an embodiment, the transistor is a positive channel metal oxide semiconductor (PMOS). When crack detection is performed, in a case that a low-level signal is inputted into the gates of the first thin-film transistor 33 and the second thin-film transistor 34, the first thin-film transistor 33 and the second thin-film transistor 34 are turned on; in a case that a high-level signal is inputted into the gates of the first thin-film transistor 33 and the second thin-film transistor 34, the first thin-film transistor 33 and the second thin-film transistor 34 are turned off. Hence, whether the first detection signal line 21 and the second detection signal line 22 are electrically connected can be controlled by controlling the switch status of the thin-film transistors. In this way, it is flexible to control the crack detection of the display panel. It should be noted that the type of the thin-film transistor is not limited in the present disclosure. In other embodiments of the present disclosure, the thin-film transistor may be NOMS and the like, which is determined according to the circumstances.

Figure 12:
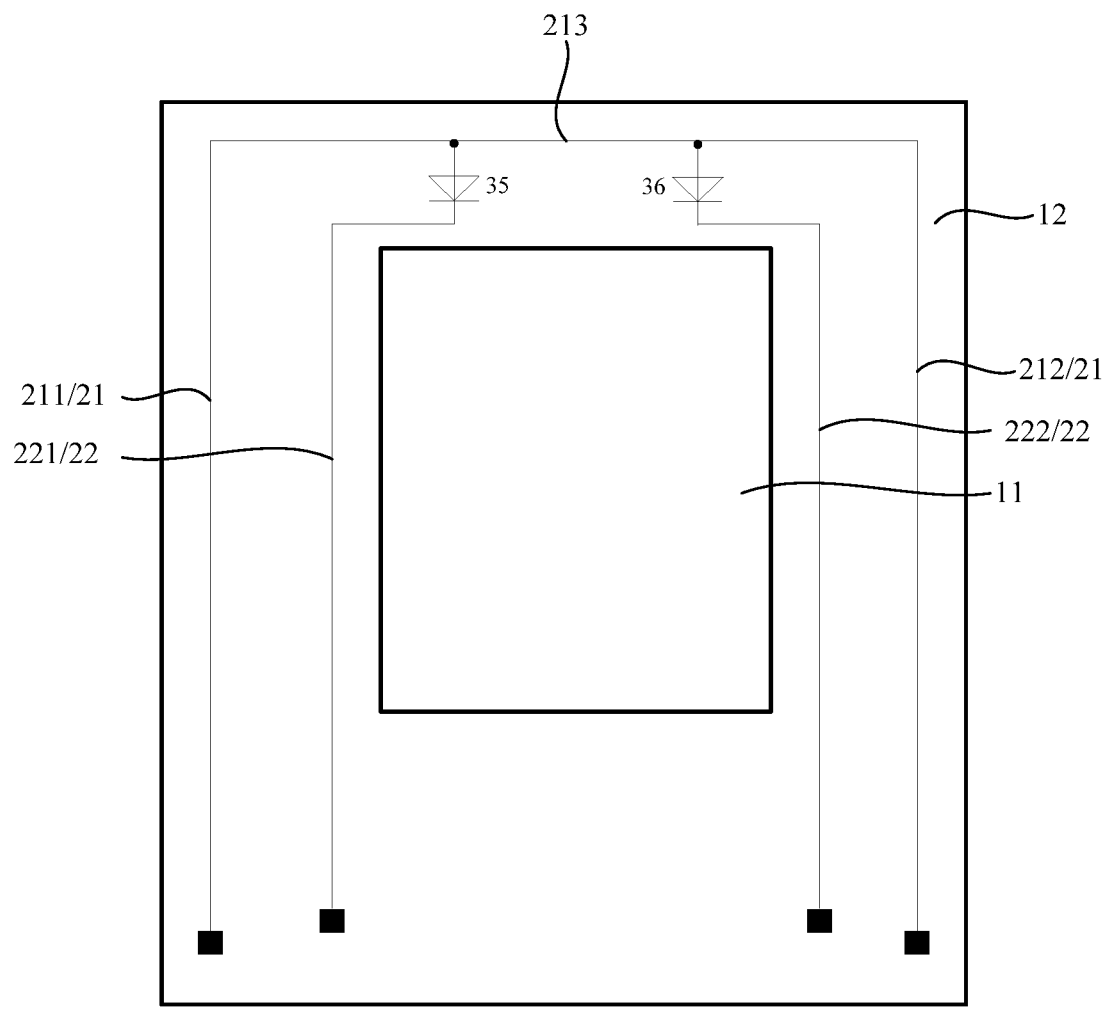
FIG. 12 is a schematic structural diagram of a display panel according to yet another embodiment of the present disclosure.

As shown in FIG. 12, which is a schematic structural diagram of a display panel according to the present disclosure, the display panel includes a first diode 35 and a second diode 36, where an anode of the first diode 35 is connected to the fifth signal lines 213, an cathode of the first diode 35 is connected to the third signal line 221, an anode of the second diode 36 is connected to the fifth signal line 213, and a cathode of the second diode 36 is connected to the fourth signal line 222, and the two terminals of the fifth signal line 213 are connected to the third signal line 221 and the fourth signal line 222 respectively. As a result, the first detection signal line 21 may provide an input signal to the second detection signal line 22. As described above, the anode of the first diode 35 is connected to the fifth signal line 213, the cathode of the first diode 35 is connected to the third signal line 221, the anode of the second diode 36 is connected to the fifth signal line 213, and the cathode of second diode 36 is connected to the fourth signal line 222. As the diode has unidirectional conductivity, the signal provided by the first signal line 211 can only be transmitted to the third signal line 221, and the signal provided by the second signal line can only be transmitted to the fourth signal line, that is, the signal transmission paths are separated, which is beneficial to improve the accuracy of crack location determination during crack detection.

In another embodiment of the present disclosure, in a case that the fifth signal line and the second detection signal line are located on the same conductive layer, the two terminals of the fifth signal line are electrically connected to the first signal line and the second signal line through via holes or through transistors respectively. The transistors include diodes and thin-film transistors.

Figure 13:
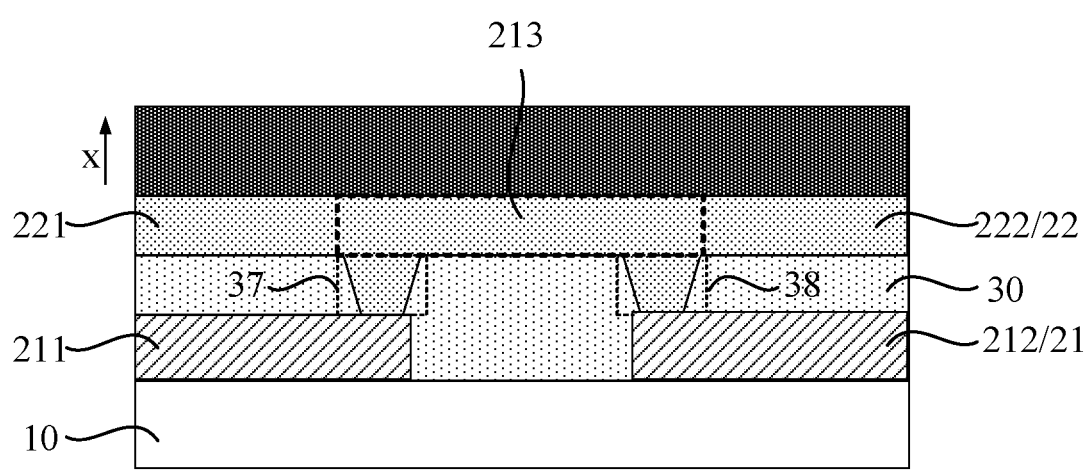
FIG. 13 is a cross-sectional diagram taken along CC1 in FIG. 5 in a case that the fifth signal line and the second detection signal line are on the same layer.

In an embodiment, in a case that the first detection signal line and the second detection signal line are electrically connected through via holes, as shown in FIG. 13, which is a schematic structural diagram of a display panel according to the present disclosure, the display panel further includes a third via hole 37 and the fourth via hole 38. Two terminals of the third via hole 37 are electrically connected to the fifth signal line 213 and the first signal line 211, respectively. Two terminals of the fourth via hole 38 are electrically connected to the fifth signal line 213 and the second signal line 211, respectively. In this way, two terminals of the fifth signal line 213 are electrically connected to the first signal line 211 and the second signal line 212 respectively, and the first detection signal line 21 is electrically connected to the second detection signal line 22, to enable the first detection signal line 21 to provide an input signal to the second detection signal line 22.

Figure 14:
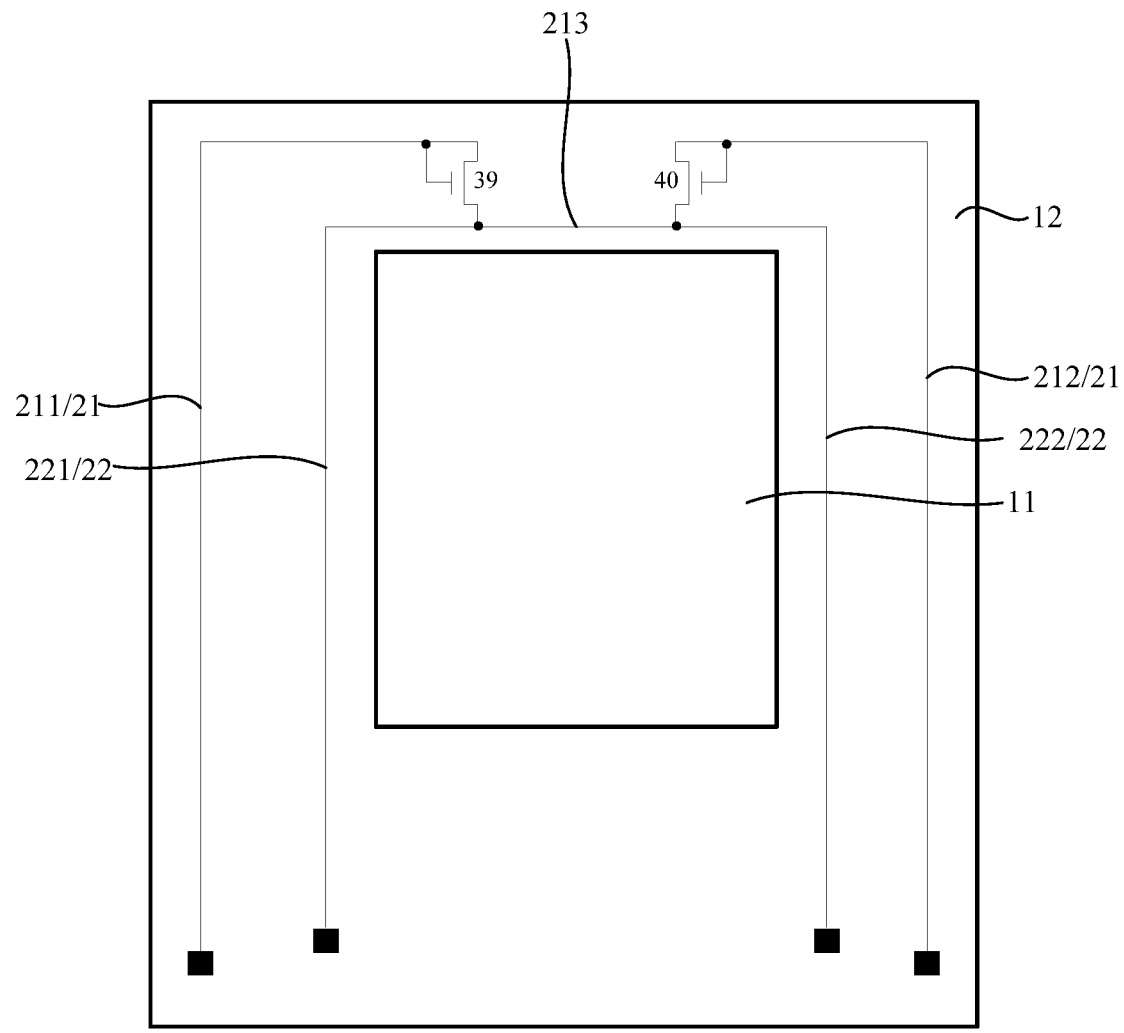
FIG. 14 is a schematic structural diagram of a display panel according to yet another embodiment of the present disclosure.

As shown in FIG. 14, which is a schematic structural diagram of a display panel according to the present disclosure, the display panel further includes a third thin-film transistor 39 and a fourth thin-film transistor 40. A source of the third thin-film transistor 39 is electrically connected to a gate of the third thin-film transistor 39, and is connected to the first signal line 211, the drain of the third thin-film transistor 39 is electrically connected to one terminal of the fifth signal line 213. A source of the fourth thin-film transistor 40 is electrically connected to a gate of the fourth thin-film transistor 40, and is electrically connected to the second signal line 212, a drain of the fourth thin-film transistor 40 is electrically connected to the fifth signal line 213. In this way, the two terminals of the fifth signal line 213 are respectively electrically connected to the first signal line 211 and the second signal line 212, and the first detection signal line 21 may provide an input signal to the second detection signal line 22.

Figure 15:
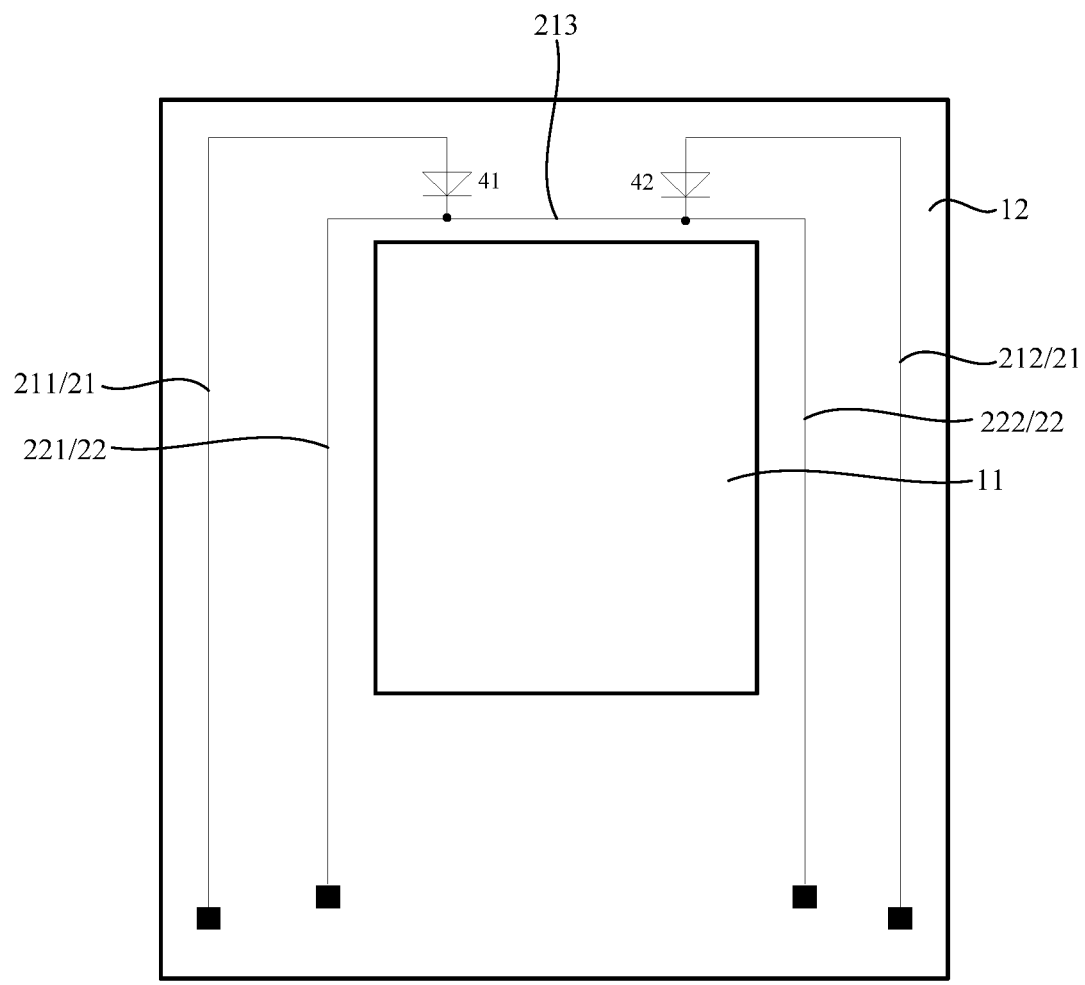
FIG. 15 is a schematic structural diagram of a display panel according to yet another embodiment of the present disclosure.

In a case that the first detection signal line and the second detection signal line are electrically connected through diodes, as shown in FIG. 15, which is a schematic structural diagram of a display panel according to the present disclosure, the display panel further includes a third diode 41 and a fourth diode 42. An anode of the third diode 41 is connected to the fifth signal line 213, a cathode of the third diode 41 is connected to the first signal line 211. An anode of the fourth diode 42 is connected to the fifth signal line 213, and a cathode of the fourth diode 42 is connected to the second signal line 212. In this way, the two terminals of the fifth signal line 213 are electrically connected to the first signal line 211 and the second signal line 212 respectively, and the first detection signal line 21 may provide an input signal to the second detection signal line 22.

It should be noted that the electrical connection between the first signal line 211 and the third signal line 221 and the electrical connection between the second signal line 212 and the fourth signal line 222 in the display panels shown in FIGS. 6 to 9 are implemented through conductive via holes. However, it can be understood that the electrical connection between the first signal line 211 and the third signal line 221 and the electrical connection between the second signal line 212 and the fourth signal line 222 in the display panel may alternatively be implemented through thin-film transistors or diodes according to the above description, which is not limited in the present disclosure and may be determined depending on specific circumstances.

Figure 16:
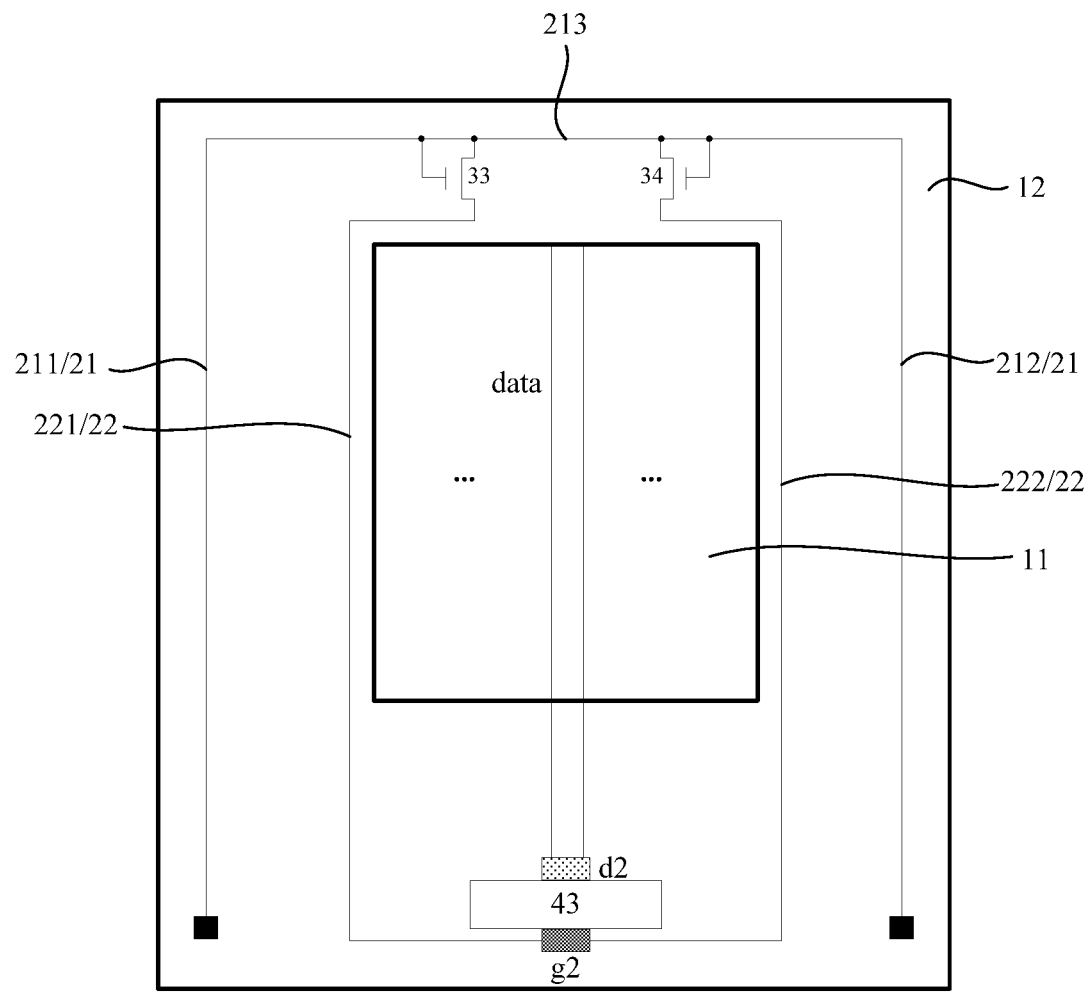
FIG. 16 is a schematic structural diagram of a display panel according to yet another embodiment of the present disclosure.

On the basis that the first detection signal line is connected to the second detection signal line through the fifth signal line, in an embodiment of the present disclosure, as shown in FIG. 16, which is a schematic structural diagram of a display panel according to the present disclosure, the display panel further includes a screen detection circuit 43, where the screen detection circuit 43 is electrically connected to data lines data in the display area 11. In an embodiment, a connection port d2 of the screen detection circuit 43 is electrically connected to the data lines data in the display area 11. The screen detection circuit 43 is located on a side of the display area 11 away from the fifth signal line 213. The second detection signal line 22 is configured to provide a first switch control signal and is electrically connected to a connection port g2 of the screen detection circuit, that is, is electrically connected to the control terminal of the screen detection circuit 43, to control the screen detection circuit 43 to provide a first screen detection signal to the data lines data. In one embodiment, reference is made to FIG. 17, which is a schematic structural diagram of a display panel according to the present disclosure. The display panel shown in FIG. 17 differs from the display panel shown in FIG. 16 in that the second detection signal line 22 is configured to provide a second screen detection signal to the screen detection circuit 43 and is electrically connected to the connection port s2 of the screen detection circuit 43, that is, is electrically connected to the input terminal of the screen detection circuit 43. In this way, the screen detection circuit 43 provides a second screen detection signal to the data lines data based on control of the second switch control signal.

In an embodiment of the present disclosure, referring to FIG. 16, the second detection signal line 22 provides the first switch control signal to control the switch status of the screen detection circuit 43. The screen detection signal is provided to the data lines data in the display area through the screen detection circuit 43, and sub-pixels electrically connected to the data lines data form a display screen based on the screen detection signal. When detecting cracks, in a case that the second detection signal line 22 does not include a disconnection, the second detection signal line 22 provides the first switch control signal to control the screen detection circuit 43 to be in the turn-on status, and the screen detection circuit 43 provides a screen detection signal to the data lines data. As a result, the sub-pixels electrically connected to the data lines data form a display screen based on the screen detection signal. In a case that the second detection signal line 22 includes a disconnection, the second detection signal line 22 cannot control the switch status of the screen detection circuit 43. Therefore, no screen detection signal is provided to the data lines data and the sub-pixels electrically connected to the data lines data cannot form a display screen. It should be noted that the sub-pixels include OLED elements for an OLED display panel, and the sub-pixels include pixel electrodes for a liquid crystal display panel.

Figure 17:
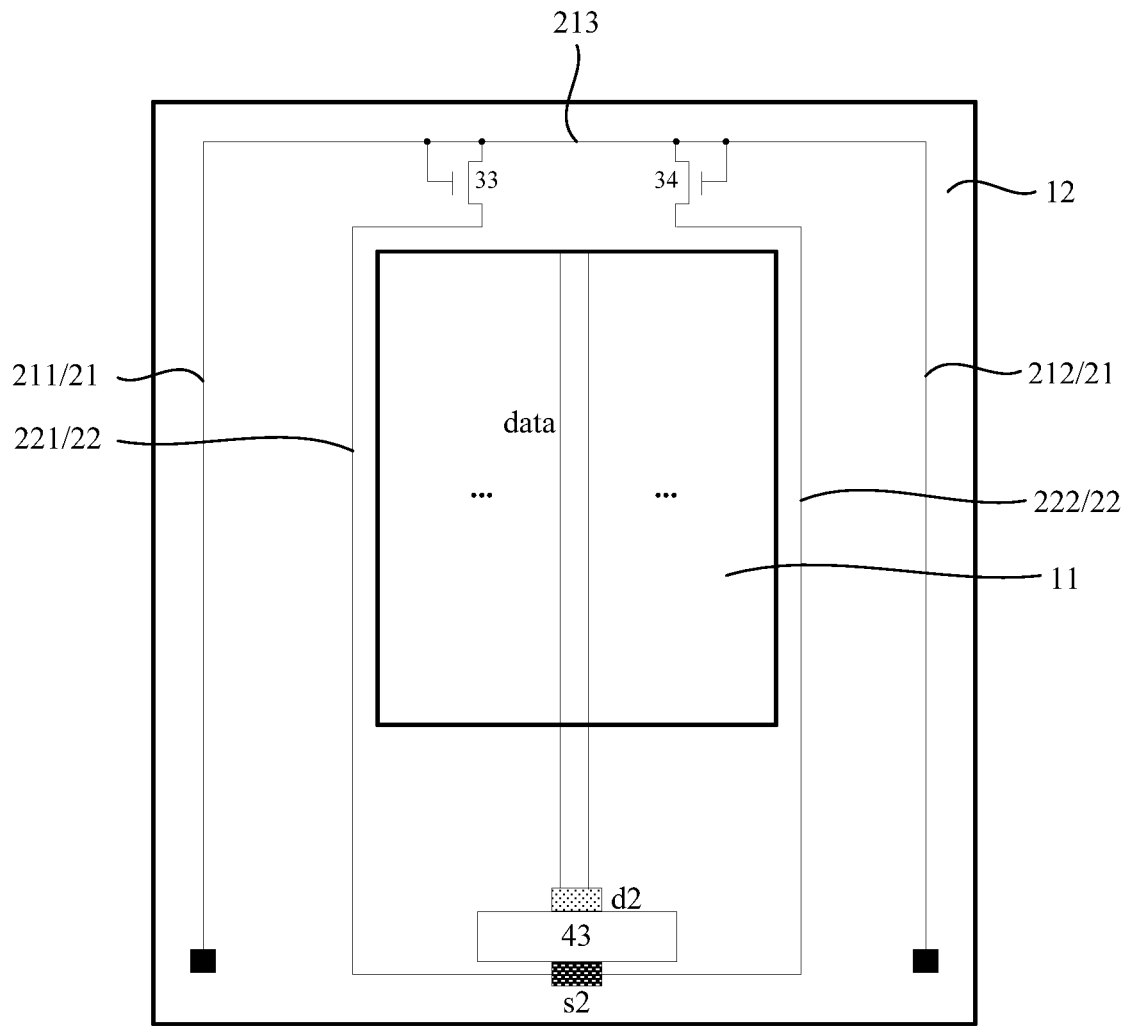
FIG. 17 is a schematic structural diagram of a display panel according to yet another embodiment of the present disclosure.

In another embodiment of the present disclosure, referring to FIG. 17, the second detection signal line 22 is configured to provide the second screen detection signal to the screen detection circuit 43, and the screen detection circuit 43 is controlled to provide a second screen detection signal to the data lines data based on control of the second switch control signal. When performing crack detection, in a case that the second detection signal line 22 does not include a disconnection, the screen detection circuit 43 is controlled to be in the turn-on status based on control of the second switch control signal and provides the second screen detection signal provided by the second detection signal line 22 to the data lines data. As a result, the sub-pixels electrically connected to the data lines data form a display screen according to the screen detection signal. In a case that the second detection signal line 22 includes a disconnection, no second screen detection signal is provided, thus the sub-pixels electrically connected to the data lines data cannot form a display screen.

In summary, when performing crack detection, in a case that the second detection signal line includes a disconnection, the sub-pixels electrically connected to the data lines cannot form a display screen, thus the second detection signal line may be used to detect whether there is a crack in the screen body of the display panel. It should be noted that whether there is a crack in the display panel can be determined through the display screen formed by the sub-pixels electrically connected to the data lines in the display area on the premise that the first detection signal line does not include a disconnection. If the first detection signal line includes a disconnection, it indicates that there is a crack in the display panel. Hence, there is no need to use the second signal detection line for crack detection.

Figure 18:
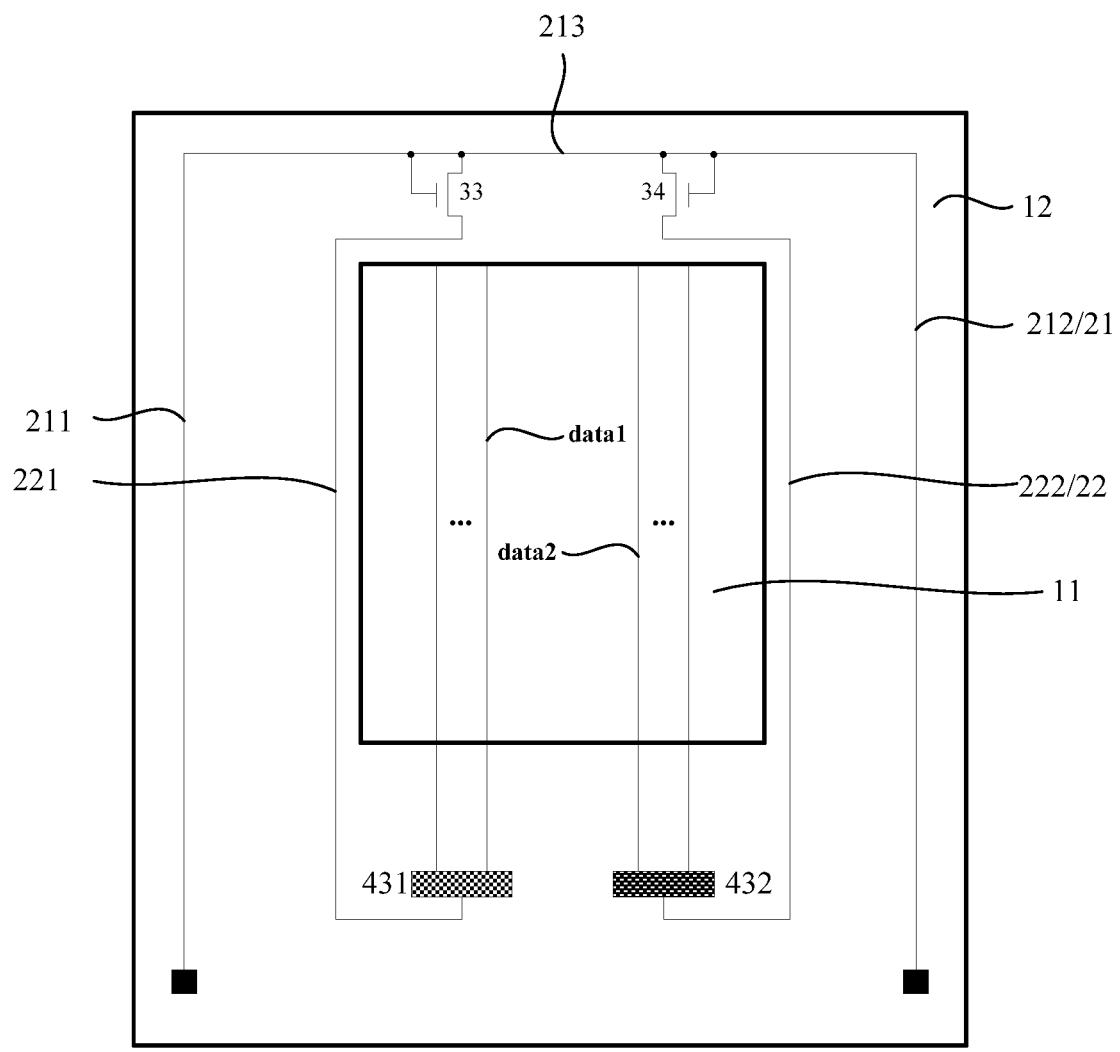
FIG. 18 is a schematic structural diagram of a display panel according to yet another embodiment of the present disclosure.

On the basis of the above embodiments, in an embodiment of the present disclosure, as shown in FIG. 18, which is a schematic structural diagram of a display panel according to the present disclosure, the screen detection circuit includes: a first detection circuit 431 and a second detection circuit 432. The first signal line 211 is connected to the first detection circuit 431 through the third signal line 221, and the first detection circuit 431 is connected to a part of the data lines data1 in the display area 11. The second signal line 212 is connected to the second detection circuit 432 through the fourth signal line 222, and the second detection circuit 432 is connected to another part of the data lines data2 in the display area 11. In this way, whether there is a disconnection in the third signal line 221 or in the fourth signal line 222 can be determined based on a display screen formed by sub-pixels corresponding to the data lines data1 and a display screen formed by sub-pixels corresponding to the data lines data2. Since the third signal line 221 and the fourth signal line 222 are located on opposite sides of the display area respectively, the location of the crack in the display panel may be determined based on the display screen formed by the sub-pixels corresponding to the third signal line 221 and the display screen formed by the sub-pixels corresponding to the fourth signal line 222. For example, the third signal line 221 and the fourth signal line 222 are located on the left side and the right side of the display area respectively, if the display screen formed by the sub-pixels corresponding to the third signal line 221 is abnormal, for example, no display screen appears, there is a crack on the left side of the screen body of the display panel. If the display screen formed by the sub-pixels corresponding to the fourth signal line 222 is abnormal, there is a crack on the right side of the screen body of the display panel.

It should be noted that when the display panel is subject to different external forces, the stresses on respective film layers in the display panel may be different. For example, in a case that the display panel is subject to a downward bending stress F, the display panel is in a downward bending status. In this case, the deformation degree of the second detection signal line on the upper layer is greater than the deformation degree of the first detection signal line on the lower layer, causing the second detection signal line to be more likely to be disconnected at a position on the second detection signal line. Therefore, there may be a situation where the first detection signal line does not include a disconnection, but the second detection signal line includes a disconnection. In this case, the first detection signal line cannot be used to detect if there is a crack in the display panel, but the second detection signal line may be used to detect a crack in the display panel. Hence, the display panel according to the present disclosure includes the first detection signal line and the second detection signal line arranged in different layers, which can improve the reliability of crack detection and crack detection rate. The first detection signal line or the second detection signal line including a disconnection indicates that the first detection signal line or the second detection signal line being disconnected at a position on the first detection signal line or the second detection signal line.

Figure 19:
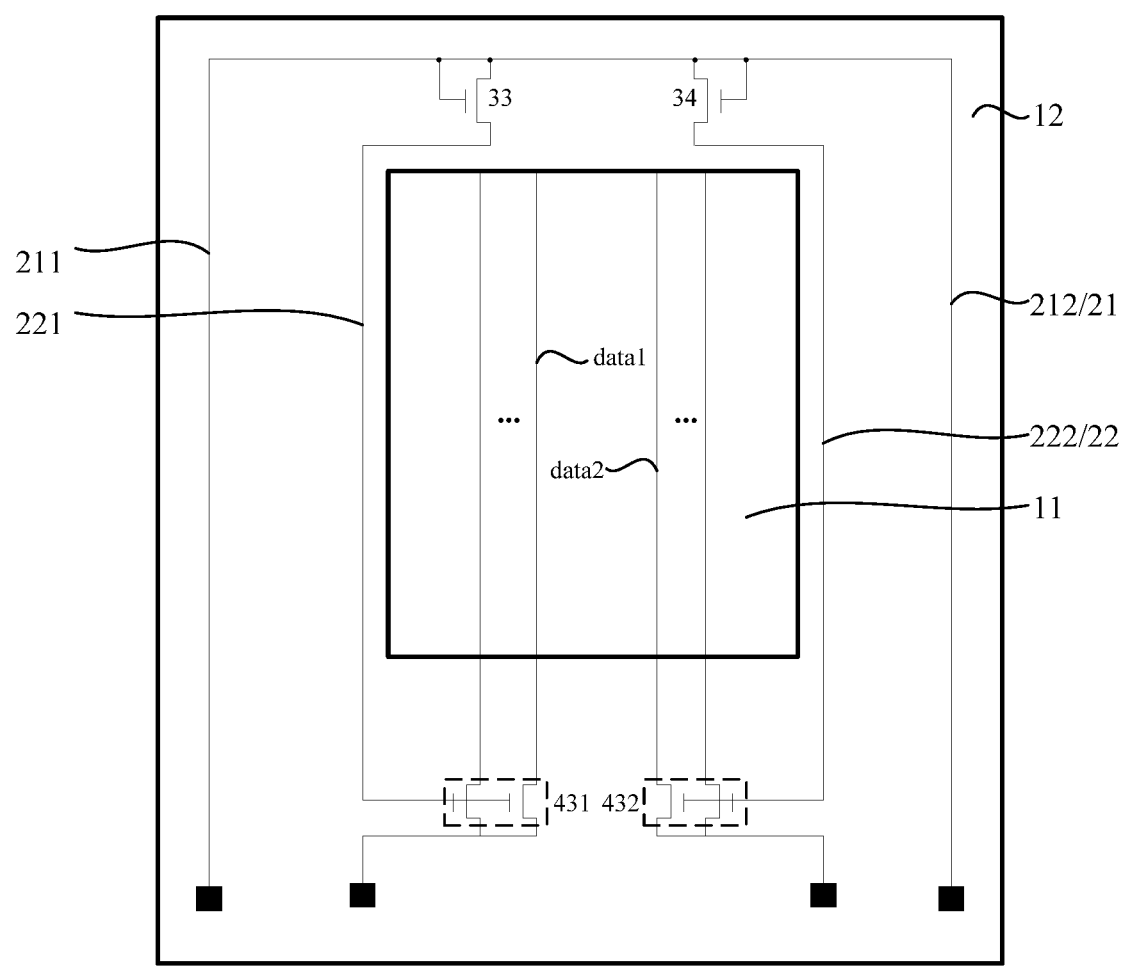
FIG. 19 is a schematic structural diagram of a display panel according to yet another embodiment of the present disclosure.

On the basis of the above-mentioned embodiments, in an embodiment of the present disclosure, as shown in FIG. 19, which is a schematic structural diagram of a display panel according to the present disclosure, the first detection circuit 431 and the second detection circuit 432 each includes a control terminal, an input terminal and an output terminal. The output terminal is connected to corresponding data lines. The output terminal of the first detection circuit 431 is connected to the data lines data1, and the output terminal of the second detection circuit 432 is connected to the data lines data2. The input terminal is configured to receive the screen detection signal provided to the data line. The input terminal of the first detection circuit 431 is configured to receive the screen detection signal provided to the data lines data1, and the input terminal of the second detection circuit 432 is configured to receive the screen detection signal provided to the data lines data2. The control terminal is configured to receive the switch control signal, that is, the control terminal of the first detection circuit 431 receives the switch control signal, and the control terminal of the second detection circuit 432 receives the switch control signal, to control the switch status of the first detection circuit 431 and the second detection circuit 432. The third signal line 221 is electrically connected to the control terminal of the first detection circuit 431, and the fourth signal line 222 is electrically connected to the control terminal of the second detection circuit 432, and the third signal line 221 provides a control signal to the first detection circuit 431 to control the switch status of the first detection circuit 431, the fourth signal line 222 provides a control signal to the second detection circuit 432 to control the switch status of the second detection circuit 432. In this way, the first detection circuit 431 and the second detection circuit 432 provides the screen detection signals to the data lines data1 and the data lines data2 respectively. In this embodiment, the input terminals of the first detection circuit 431 and the second detection circuit 432 receive screen detection signals through external lines.

Figure 20:
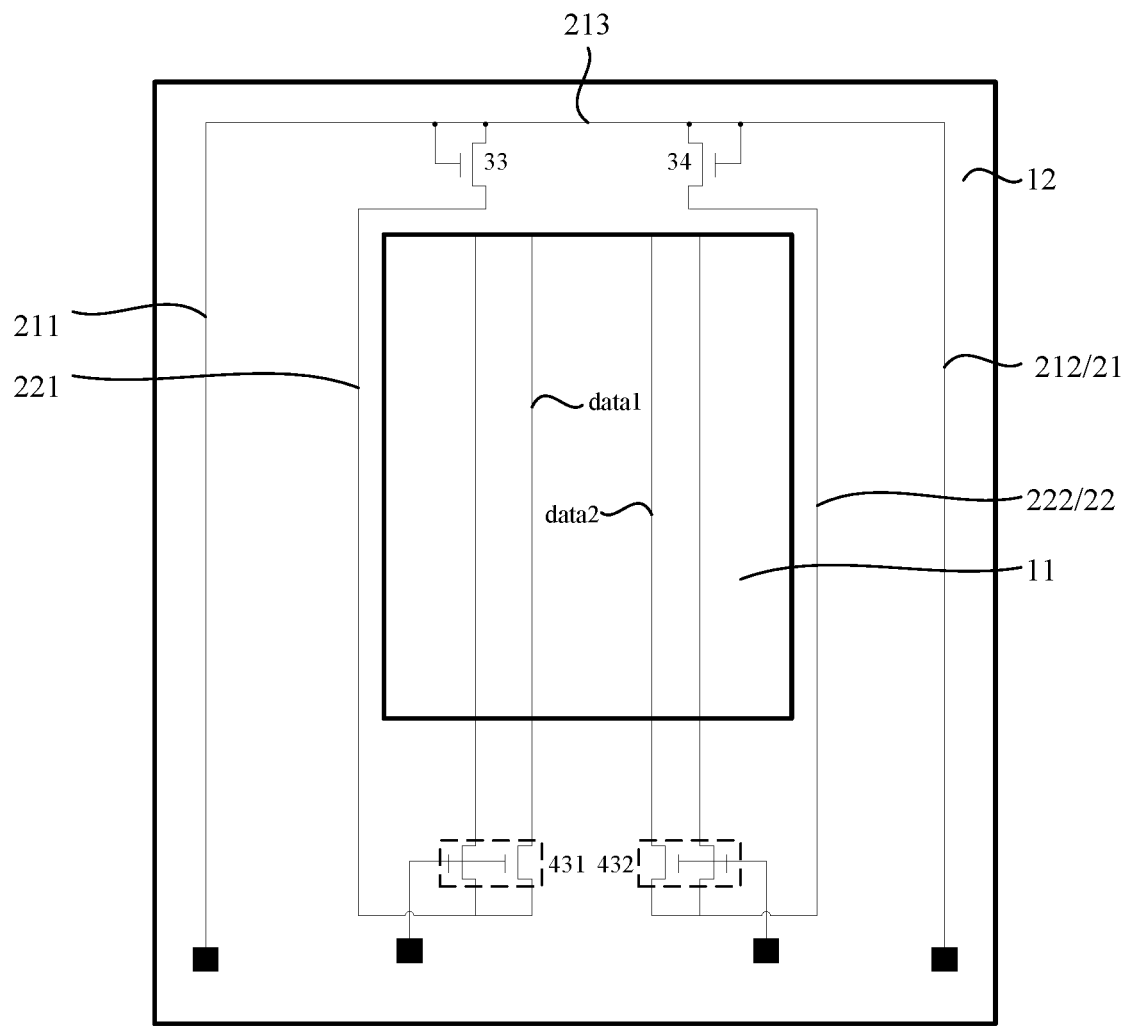
FIG. 20 is a schematic structural diagram of a display panel according to yet another embodiment of the present disclosure.

Alternatively, as shown in FIG. 20, which is a schematic structural diagram of a display panel according to the present disclosure, the display panel shown in FIG. 20 differs from the display panel shown in FIG. 19 in that: the third signal line 221 is electrically connected to the input terminal of the first detection circuit 431, and the fourth signal line 222 is electrically connected to the input terminal of the second detection circuit 432. In this way, the third signal line 221 provides a screen detection signal to the data lines data1, and the fourth signal line 222 provides a screen detection signal to the data lines data2, and the sub-pixels electrically connected to each of the data lines data1 and the data lines data2 form a display screen according to the screen detection signal. It should be noted that the control terminal of each of the first detection circuit 431 and the second detection circuit 432 forms the signal port g2 of the screen detection circuit, that is, the control terminal of the screen detection circuit. The output terminal of each of the first detection circuit 431 and the second detection circuit 432 forms the signal port d2 of the screen detection circuit, and the input terminal of each of the first detection circuit 431 and the second detection circuit 432 forms the signal port s2 of the screen detection circuit, that is, the input terminal of the screen detection circuit.

Based on the above description, if the third signal line 221 includes a disconnection, the sub-pixels electrically connected to the data lines data1 cannot form a display screen; and if the fourth signal line 222 includes a disconnection, the sub-pixels electrically connected to the data lines data2 cannot form a display screen. Hence, whether the third signal line 221 includes a disconnection may be determined according to the situation of the display screen formed by the sub-pixels electrically connected to the data lines data1. Similarly, whether the fourth signal line 222 includes a disconnection may be determined according to the situation of the display screen formed by the sub-pixels electrically connected to the data lines data2. Since the third signal line 221 and the fourth signal line 222 are located on opposite sides of the display area respectively, the location of the crack in the screen body of the display panel, for example, the crack is on which side, may be determined according to the situation of the display screen formed by the sub-pixels electrically connected to the data lines data1 and the situation of the display screen formed by the sub-pixels electrically connected to the data lines data2.

Figure 21:
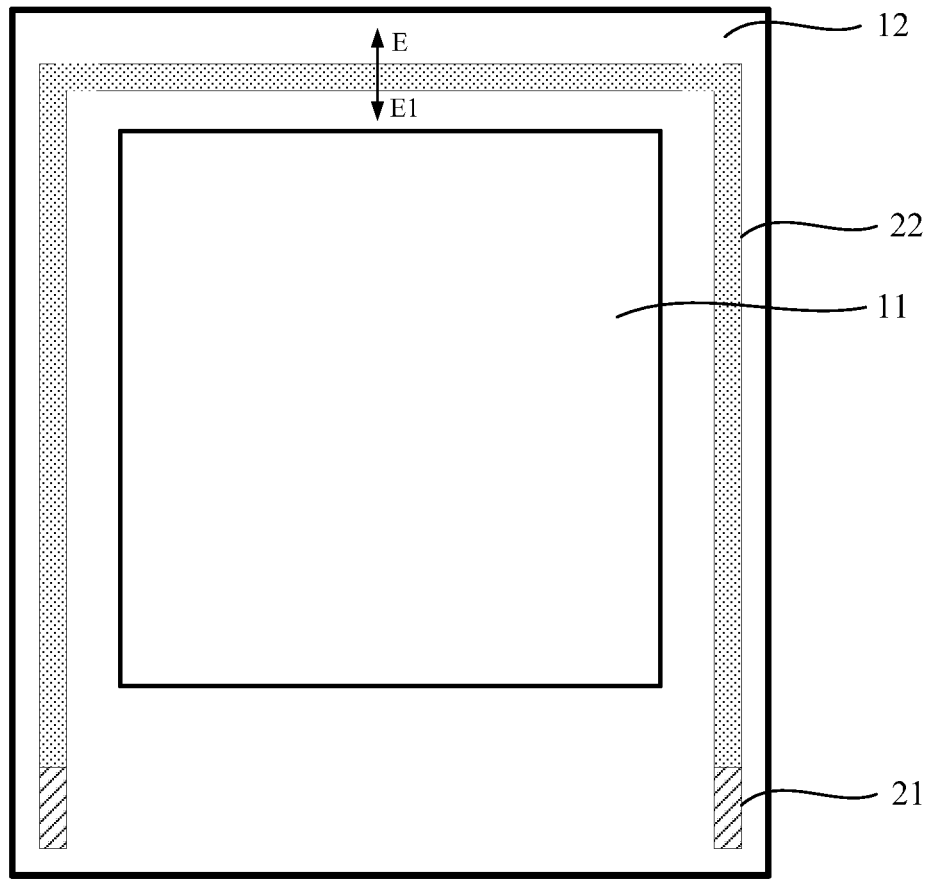
FIG. 21 is a schematic structural diagram of a display panel according to yet another embodiment of the present disclosure.
Figure 22:
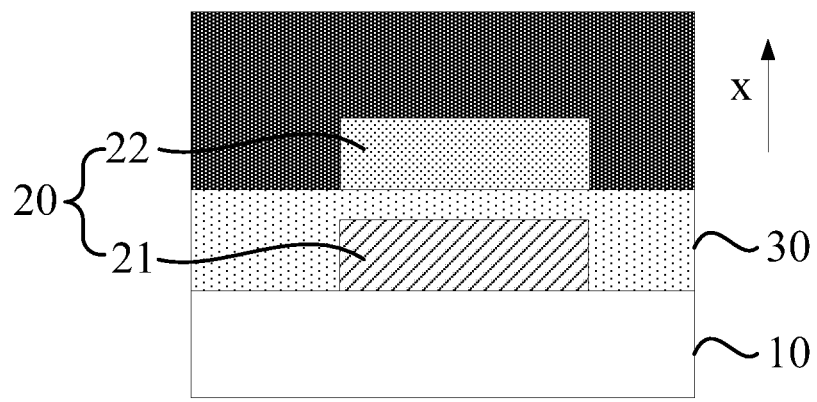
FIG. 22 is a cross-sectional diagram taken along EE1 in FIG. 21.

According to the present disclosure, in addition to the first detection signal line and the second detection signal line in the display panel being connected through the fifth signal line, the first detection signal line and the second detection signal line may alternatively be not electrically connected. Therefore, in an embodiment of the present disclosure, as shown in FIG. 21 and FIG. 22, where FIG. 21 is a schematic structural diagram of a display panel according to the present disclosure, and FIG. 22 is a cross-sectional diagram taken along EE1 in FIG. 21, in the first direction x, the first detection signal line 21 and the second detection signal line 22 are directly opposite to each other and are insulated from each other. In other words, the first detection signal line 21 and the second detection signal line 22 are arranged in different layers, the orthographic projections of the first detection signal line 21 and the second detection signal line 22 on the substrate 10 are completely overlapped, and the first detection signal line 21 and the second detection signal line 22 are not electrically connected with each other. The two terminals of the first detection signal line 21 are a first terminal and a second terminal respectively, and the two terminals of the second detection signal line 22 are a third terminal and a fourth terminal respectively. The first terminal and the second terminal are first resistance signal detection terminals, and resistance of the first detection signal line 21 may be measured by utilizing the first terminal and the second terminal. The third terminal and the fourth terminal are second resistance signal detection terminals, and resistance of the second detection signal line 22 may be measured by utilizing the third terminal and the fourth terminal. Whether the first detection signal line 21 includes a disconnection may be determined based on the measured resistance of the first detection signal line 21. Whether the second detection signal line 22 includes disconnection may be determined based the measured resistance of the second detection signal line 22. As a result, whether there is a crack in the screen body of the display panel may be further determined. It should be noted that, in this embodiment, it may be understood that the first detection signal line 21 and the second detection signal line 22 each includes the fifth signal line on the same layer. Two terminals of fifth signal line on the same layer as the first detection signal line 21 are respectively connected to the first signal line and the second signal line, thus the fifth signal line along with the first signal line and the second signal line form the first detection signal line 21. Two terminals of the fifth signal line on the same layer as the second detection signal line 22 are respectively connected to the third signal line and the fourth signal line, thus the fifth signal line along with the third signal line and the fourth signal line form the second detection signal line 22.

Correspondingly, an electronic device is further provided according to the present disclosure, which includes the display panel according to any one of the above embodiments.

The electronic device may be an electronic device with a display function such as a mobile phone, a tablet computer, and a display wearable device. It should be noted that the structure of the display panel in the electronic device has been described in detail in the foregoing embodiments, which will not be repeated here.

Figure 23:
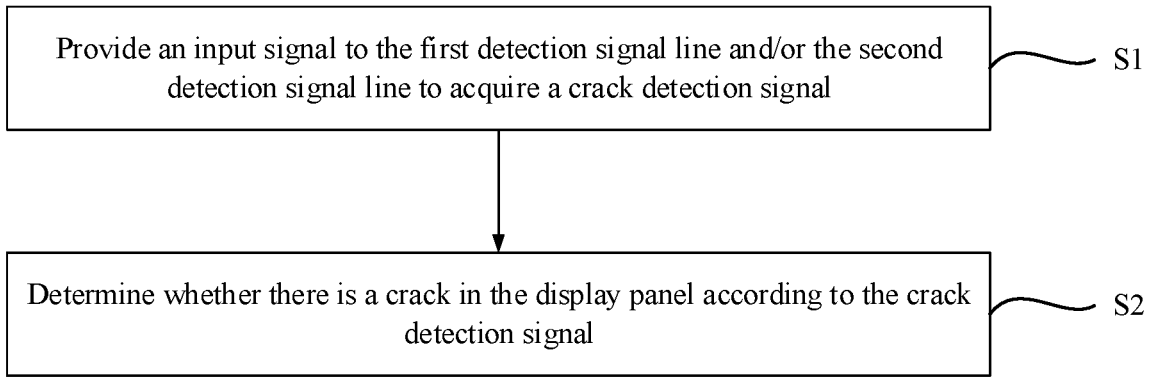
FIG. 23 is a flow chart of a crack detection method according to an embodiment of the present disclosure.

Further, a crack detection method for a display panel is provided according to the present disclosure. As shown in FIG. 1 and FIG. 2, the display panel includes: a substrate 10; a detection signal line 20 located on a side of the substrate 10; a display area 11 and a non-display area 12 surrounding the display area 11; and an inorganic layer 30. The detection signal line 20 is located in the non-display area 12, and includes a first detection signal line 21 and a second detection signal line 22 arranged in sequence in a first direction x. The inorganic layer 30 located between a conductive layer where the first detection signal line 21 is located and a conductive layer where the second detection signal line 22 is located. The first detection signal line 21 and the second detection signal line 22 are at least partially overlapped in the first direction x, where the first direction x is perpendicular to a plane where the substrate 10 is located. As shown in FIG. 23, the crack detection method includes following steps S1 and S2.

In S1, an input signal is provided to the first detection signal line 21 and/or the second detection signal line 22 to acquire a crack detection signal.

In S2, whether there is a crack in the display panel is determined according to the crack detection signal.

In the embodiment of the present disclosure, the crack detection method includes providing an input signal to the first detection signal line and/or the second detection signal line, that is, the crack detection method includes providing an input signal to the first detection signal line, providing the input signal to the second detection signal line, and providing input signals to the first detection signal line and the second detection signal line to acquire a crack detection signal, and determining whether there is a crack in the display panel according to the crack detection signal. When the crack detection method is used for crack detection, the first detection signal line may be used for crack detection, the second detection signal line may be used for crack detection, or the first detection signal line and the second detection signal line may be used collaboratively for crack detection, and the detection method may be used to detect cracks in a variety of manners. In actual detection, one or more of the above detection manners may be used for crack detection, which has good flexibility and strong practicability. In addition, the crack detection method includes multiple crack detection manners, which makes the crack detection method more reliable and has a higher crack detection rate.

Figure 24:
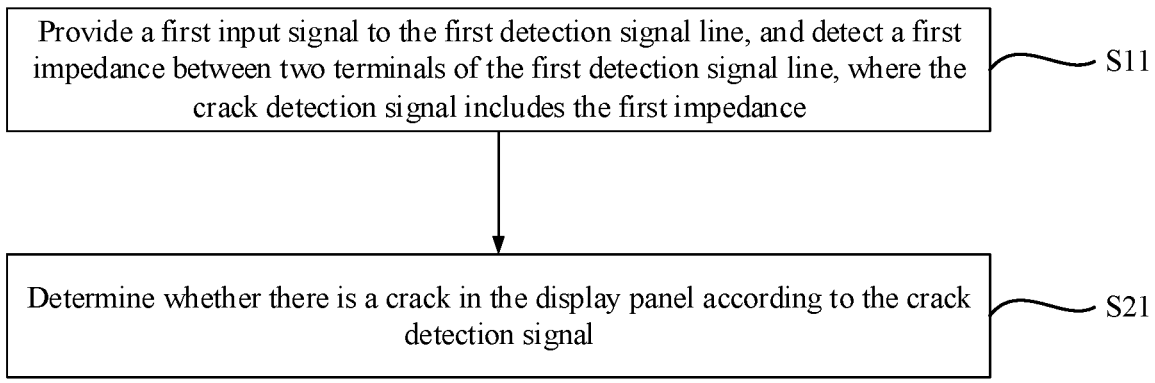
FIG. 24 is a flow chart of a crack detection method according to another embodiment of the present disclosure.

On the basis of the above embodiments, in an embodiment of the present disclosure, as shown in FIG. 6, the first detection signal line 21 and the second detection signal line 22 in the display panel are arranged in different layers and are at least partially overlapped in the first direction x. In an embodiment, the first detection signal line 21 includes a first signal line 211 and a second signal line 212 located on opposite sides of the display area 11 respectively; the second detection signal line 22 includes a third signal line 221 and a fourth signal line 222 located on opposite sides of the display area 11 respectively; the detection signal line further includes a fifth signal line 213, where the first signal line 211 is electrically connected to the second signal line 212 through the fifth signal line 213, and the third signal line 221 is electrically connected to the fourth signal line 222 through the fifth signal line 213, and the fifth signal line 213 is on the same layer as the first detection signal line, i.e., the fifth signal line 213 is on the same layer as the first signal line 211 and the second signal line 212, or the fifth signal line 213 is on the same layer as the second detection signal line, i.e., the fifth signal line 213 is on the same layer as the third signal line 221 and the fourth signal line 222. In this case, the above step S1 is shown as step S11 in the detection method shown in FIG. 24. Referring to FIG. 24, which is a flow chart of a crack detection method according to the present disclosure, the crack detection method includes following steps S11 and S21.

In S11, a first input signal is provided to the first detection signal line 21, and a first impedance between two terminals of the first detection signal line 21 is detected, where the crack detection signal includes the first impedance. It should be noted that, a multimeter or an ohmmeter may be used for measuring the first impedance between the two terminals of the first detection signal line 21. In this case, the first input signal is provided to the first detection signal line 21 through the multimeter or the ohmmeter.

Step S21 is the same as the above step S2, that is, whether there is a crack in the display panel is determined according to the crack detection signal.

In this embodiment of the present disclosure, the impedance (i.e., resistance) between the two terminals of the first detection signal line is measured. Then, it is determined whether the first detection signal line includes a disconnection based on the measured impedance between the two terminals of the first detection signal line. In a case that the first detection signal line does not include a disconnection, the measured impedance between the two terminals of the first detection signal line is a constant value. In a case that the first detection signal line includes a disconnection, the measured impedance between the two terminals of the first detection signal line is infinite. Therefore, by measuring the impedance between the two terminals of the first detection signal line, whether the first detection signal line includes a disconnection is determined, which may be used to further determine whether there is a crack in the screen body of the display panel.

Figure 25:
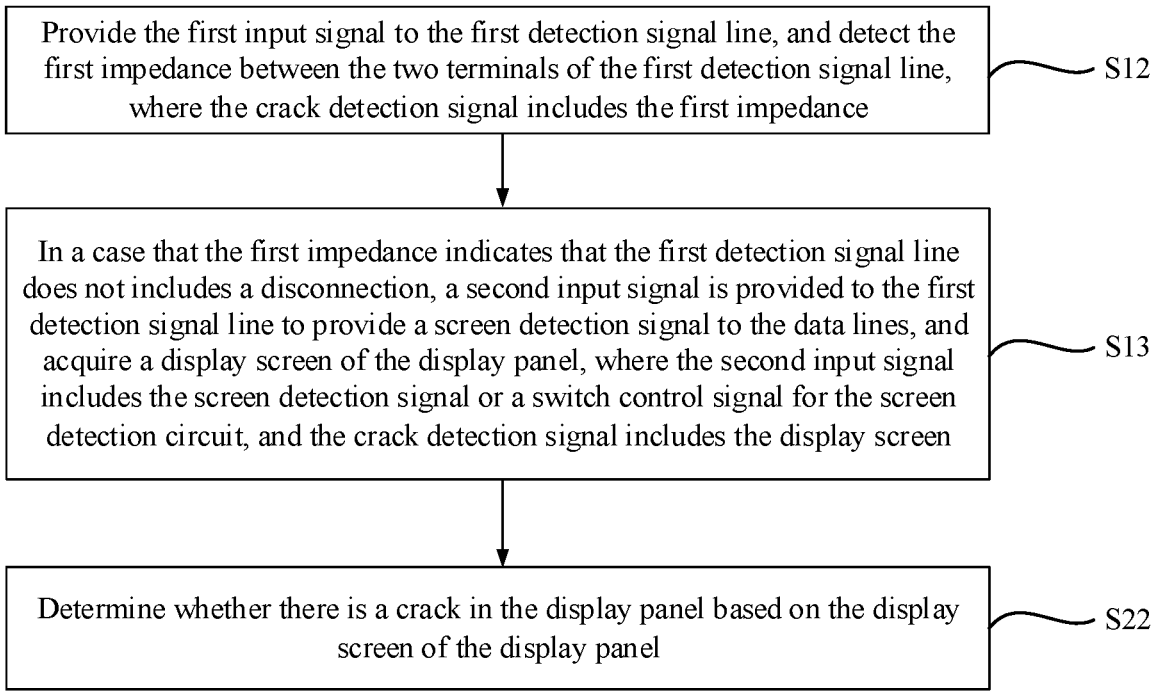
FIG. 25 is a flow chart of a crack detection method according to yet another embodiment of the present disclosure.

On the basis of the above-mentioned embodiments, in an embodiment of the present disclosure, as shown in FIG. 16 or 17, the display panel further includes the screen detection circuit 43, the screen detection circuit 43 is electrically connected to the data lines (data) in the display area 11, and the screen detection circuit 43 is located in the non-display area 12 at the side of the display area 11 away from the fifth signal line 213. The second signal detection line 22 is electrically connected to the screen detection circuit 43. In this case, the above step S1 includes the steps S12 and S13 in the detection method shown in FIG. 25. Referring to FIG. 25, which is a schematic flowchart of a crack detection method according to another embodiment of the present disclosure, the method includes following steps S12, S13 and S22.

In S12, the first input signal is provided to the first detection signal line 21, and the first impedance between the two terminals of the first detection signal line 21 is detected, where the crack detection signal includes the first impedance.

In S13, in a case that the first impedance indicates that the first detection signal line does not includes a disconnection, a second input signal is provided to the first detection signal line 21 to provide a screen detection signal to the data lines, to cause the sub-pixels electrically connected to the data lines data to form a display screen in response to the screen detection signal, and the display screen of the display panel is acquired. The second input signal includes a screen detection signal or a switch control signal for the screen detection circuit 43, and the crack detection signal includes the display screen of the display panel.

Step S22 is the same as the above step S2, including determining whether there is a crack in the display panel based on the display screen of the display panel.

In an embodiment of the present disclosure, as shown in FIG. 16, the second detection signal line 22 is electrically connected to the signal port g2 of the screen detection circuit 43, that is, is electrically connected to the control terminal of the screen detection circuit 43, to provide the first switch control signal to control the switch status of the screen detection circuit 43. When performing crack detection, the second detection signal line 22 provides the first switch control signal to control the screen detection circuit 43 to be in the turn-on status, and the screen detection circuit 43 provides the screen detection signal to the data lines data. As a result, the sub-pixels electrically connected to the data lines data display in response to the screen detection signal. In a case that the second signal detection line 22 includes a disconnection, the first switch control signal is be provided, and the screen detection circuit 43 is not controlled to be in the turn-on status. As a result, the screen detection signal is not provided to the data lines data, and the sub-pixels electrically connected to the data lines data do not form a display screen.

In another embodiment of the present disclosure, as shown in FIG. 17, the second detection signal line 22 is electrically connected to the signal port s2 of the screen detection circuit 43, that is, is electrically connected to the input terminal of the screen detection circuit 43 to provide a screen detection signal to the screen detection circuit 43. When performing crack detection, the screen detection circuit 43 controlled to be in the turn-on status in response to the second switch control signal, and provides the screen detection signal provided by the second detection signal line 22 to the data lines data, and the sub-pixels electrically connected to the data lines data form a display screen. In a case that the second detection signal line 22 includes a disconnection, the screen detection signal is not provided. Even if the screen detection circuit 43 is turned on under the control of the second switch control signal, the sub-pixels electrically connected to the data lines data do not form a display screen.

Based on the above description, no matter whether the second detection signal line provides the switch control signal or the screen detection signal, in a case that the second detection signal line includes a disconnection, the sub-pixels electrically connected to the data lines do not form a display screen. Hence, by using the crack detection method of the present disclosure, whether the second detection signal line includes a disconnection can be determined according to the display screen formed by the sub-pixels electrically connected to the data lines, and whether there is a crack in the display panel can be further determined.

In addition, by using the detection method of the present disclosure, whether the data lines and the sub-pixels have malfunctions may be determined according to whether the sub-pixels electrically connected to the data lines display a screen. In an embodiment, as shown in FIG. 16 or FIG. 17, the screen detection circuit 43 is electrically connected to multiple data lines data in the display area. During detection, in a case that sub-pixels corresponding to one part of the multiple data lines data display a screen, while sub-pixels corresponding to another part of the multiple data lines data does not display a screen, the part of data lines data corresponding to the sub-pixels that do not display the screen have malfunction, resulting in the screen detection signal is not provided to the sub-pixels electrically connected the part of data lines data. In a case that a part of sub-pixels electrically connected to a data line data display a screen, while another part of sub-pixels electrically connected to the data line data do not display a screen, the part of sub-pixels that do not display the screen have malfunction.

Figure 26:
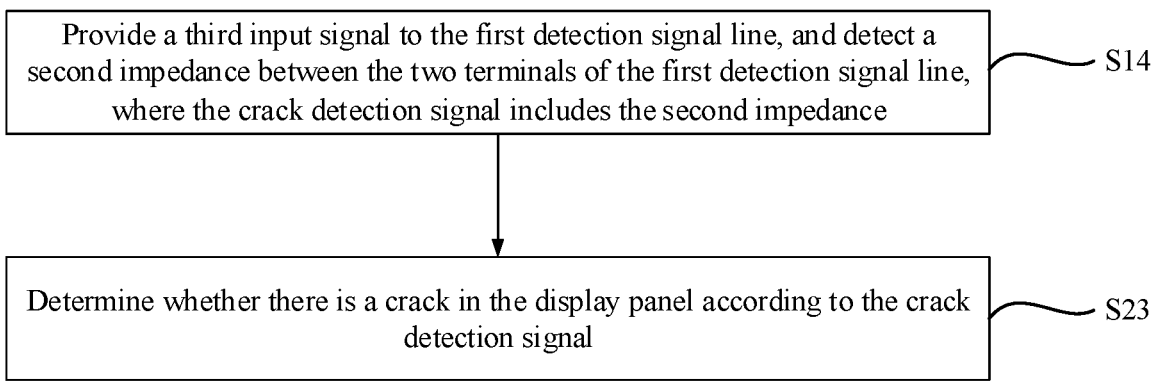
FIG. 26 is a flow chart of a crack detection method according to yet another embodiment of the present disclosure.

In the crack detection method according to the present disclosure, in addition to the first detection signal line and the second detection signal line of the display panel are electrically connected through the fifth signal line, the first detection signal line and the second signal detection line may alternatively be not electrically connected. Therefore, in an embodiment of the present disclosure, as shown in FIG. 22, in the first direction x, the first detection signal line 21 is directly opposite to and is insulated from the second detection signal line 22. In this case, the above step S1 is shown as the step S14 in the detection method in FIG. 26. Referring to FIG. 26, which is a flow chart of a crack detection method according to yet another embodiment of the present disclosure, the method includes following steps S14 and S23.

In S14, a third input signal is provided to the first detection signal line 21, and detect a second impedance between the two terminals of the first detection signal line 21, that is, the resistance between two terminals of the first detection signal line 21, where the crack detection signal includes the second impedance.

Step S23 is the same as the above step S2, including determining whether there is a crack in the display panel according to the crack detection signal. The crack detection signal is the impedance between the two terminals of the first detection signal line 21. In a case that the first detection signal line 21 does not includes a disconnection, the measured impedance between two terminals of the first detection signal line 21 is a constant value. In a case that the first detection signal line 21 includes a disconnection, the measured impedance between the two terminals of the first detection signal line 21 is infinite. Therefore, by measuring the impedance between the two terminals of the first detection signal line 21, whether the first detection signal line 21 includes a disconnection can be determined, and whether there is a crack in the screen body of the display panel is further determined.

Figure 27:
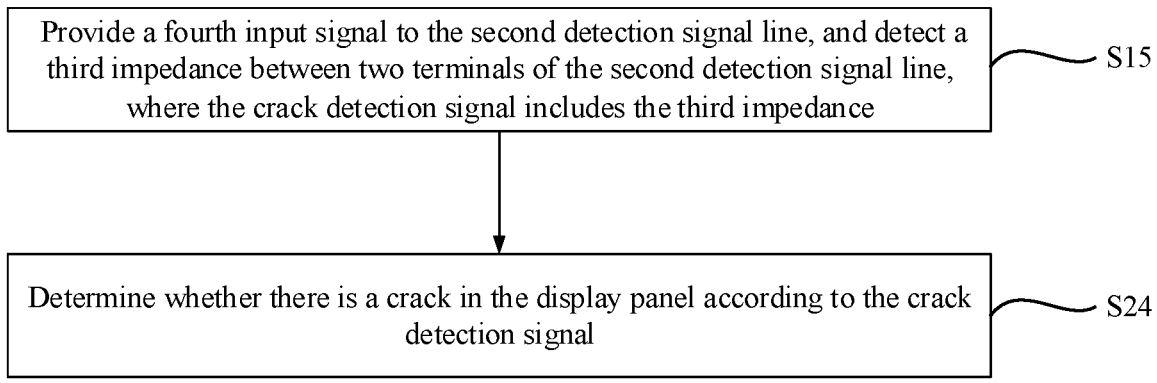
FIG. 27 is a flow chart of a crack detection method according to yet another embodiment of the present disclosure.

On the basis of the above embodiments, in an embodiment of the present disclosure, as shown in FIG. 27, which is a flow chart of a crack detection method according to yet another embodiment of the present disclosure, the method includes following steps S15 and S24.

In S15, a fourth input signal is provided to the second detection signal line 22, and a third impedance between two terminals of the second detection signal line 22 is detected, where the crack detection signal includes the third impedance.

After the crack detection signal is acquired, the crack detection method further includes following step S24.

Step S24 is the same as the above step S2, including determining whether there is a crack in the display panel according to the crack detection signal. In an embodiment, in a case that the second detection signal line 22 does not include a disconnection, the measured impedance between the two terminals of the second detection signal line 22 is a constant value. In a case that the second detection signal line 22 includes a disconnection, the measured impedance between the two terminals of the second detection signal line 22 is infinite. Therefore, by measuring the impedance between the two terminals of the second detection signal line 22, whether the second detection signal line 22 includes a disconnection can be determined, and whether there is a crack in the screen body of the display panel is further determined.

Figure 28:
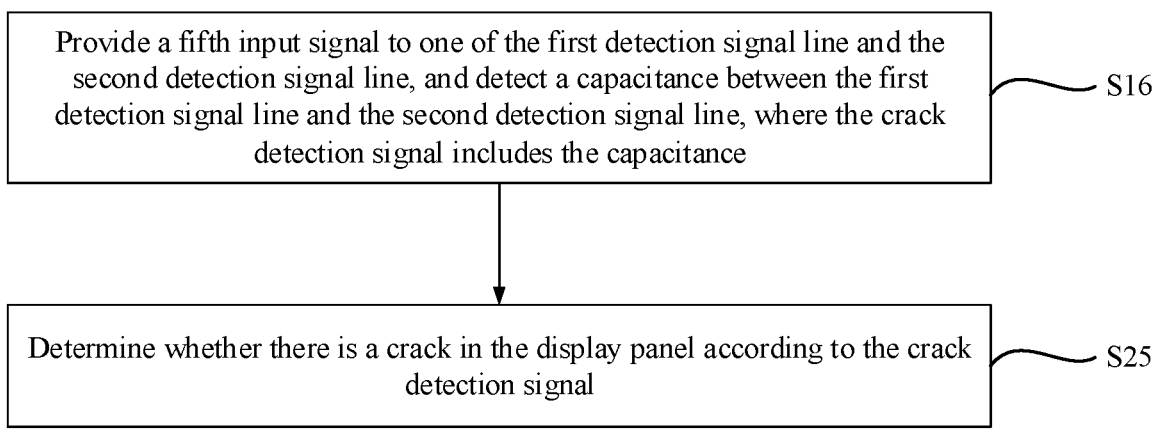
FIG. 28 is a flow chart of a crack detection method according to yet another embodiment of the present disclosure.

In addition, in the embodiment of the present disclosure, the first detection signal line 21 is directly opposite to and is insulated from the second detection signal line 22, and the first detection signal line 21 and the second detection signal line 22 form a capacitor. Whether there is a crack in the display panel may be determined by measuring the capacitance of the capacitor. Therefore, as shown in FIG. 28, which is a schematic flowchart of a crack detection method according to yet another embodiment of the present disclosure, a crack detection method includes following steps S16 and S25.

In S16, a fifth input signal is provided to one of the first detection signal line 21 and the second detection signal line 22, and a capacitance between the first detection signal line 21 and the second detection signal line 22 is detected, where the crack detection signal includes the capacitance. It should be noted that the capacitance between the first detection signal line 21 and the second detection signal line 22 may be measured by a multimeter. During measurement, two probes of the multimeter are respectively placed on the first detection signal line 21 and the second detection signal line, to input an electrical signal to one of the first detection signal line 21 and the second detection signal line 22 to measure the capacitance value between the first detection signal line 21 and the second detection signal line 22.

Step S25 is the same as the above step S2, including determining whether there is a crack in the display panel according to the crack detection signal, that is, whether there is a crack in the display panel is determined according to the measured capacitance value.

The first detection signal line 21 and the second detection signal line 22 form a capacitor, and the capacitance of the capacitor formed by the first detection signal line 21 and the second detection signal line 22 is a constant value. When performing crack detection, in a case that both the first detection signal line 21 and the second detection signal line 22 do not include a disconnection, the measured capacitance value is the above constant value, or approximately the above constant value. In a case that one or both of the first detection signal line 21 and the second detection signal line 22 include a disconnection, the measured capacitance value is not the above constant value. Therefore, in the embodiment of the present disclosure, using the crack detection method to detect whether there is a crack in the display panel includes: detecting the capacitance between the first detection signal line 21 and the second detection signal line 22, and comparing the measured capacitance value with the above constant value, that is, with the capacitance value when neither the first detection signal line 21 nor the second detection signal line 22 includes a disconnection, to determine whether there is a crack in the display panel.

It should be noted that whether the first detection signal line 21 includes a disconnection or the second detection signal line 22 includes a disconnection, the measured capacitance value is changed. Any one of the first detection signal line 21 and the second detection signal line 22 including a disconnecting indicates that there is a crack in the display panel. Therefore, in a case that the measured capacitance value is not the expected capacitance value, it is determined that there is a crack in the display panel. In addition, a disconnection in the first detection signal line 21 or the second detection signal line 22 divides the capacitor formed by the first detection signal line and the second detection signal line into multiple capacitors, and only one of the capacitors can be detected. Therefore, if the first detection signal line 21 and the second detection signal line 22 includes a disconnection, the measured capacitance value is reduced and is less than the above constant value, and it is determined that there is a crack in the display panel.

It should be noted that since the capacitance measurement is easily affected by other metal lines around the detection signal line, the display panel according to the present disclosure requires that there is no other metal line within 10 μm around the locations of the first detection signal line 21 and the second detection signal line 22. However, in a case that other metal lines around the first detection signal line 21 and the second detection signal line 22 are unavoidable, the metal lines are required to be arranged symmetrically around the first detection signal line 21 and the second detection signal line 22.

On the basis that there is no other metal line within 10 μm around the locations of the first detection signal line 21 and the second detection signal line 22 or metal lines are arranged symmetrically, if the measured capacitance between the first detection signal line 21 and the second detection signal line 22 is half of a preset capacitance value, there is a disconnection at the middle location of the first detection signal line 21 and/or the second detection signal line 22.

As described above, when the display panel is subjected to different external forces, respective film layers in the display panel may receive different stresses. Hence, even if there is a crack in the display panel, the crack in the display panel cannot be detected through only the first detection signal line or the second detection signal line. In this case, both the first detection signal line and the second detection signal line are used to detect a crack in the display panel. Therefore, in an embodiment of the present disclosure, on the premise that the first detection signal line is directly opposite to and is insulated from the second detection signal line, after detecting the resistance of the first detection signal line and determining that the first detection signal line includes a disconnection, the resistance of the second detection signal line is detected to further determine whether there is a crack in the display panel, or the capacitance between the first detection signal line and the second detection signal line is detected to further determine whether there is a crack in the display panel. In this way, failure in detecting the crack in the display panel can be avoided.

In addition, if there are errors in the measurement results of the resistance detection and capacitance detection due to the failure of the detection device or other reasons, whether there is a crack in the display panel may be determined incorrectly. In order to avoid such situation, the crack detection method according to the present disclosure further includes: measuring the impedance between the two terminals of the first detection signal line, measuring the impedance between the two terminals of the second detection signal line, and measuring the capacitance between the first detection signal line and the second detection signal line, and combining results of the above measurements to determine whether there is a crack in the display panel, to avoid the situation of determining whether there is a crack in the display panel incorrectly.

For the crack detection method according to the present disclosure, if the first detection signal line or the second detection signal line is used to correctly determine whether there is a crack in the display panel, after using the first detection signal line or the second detection signal line to perform crack detection, there is no need to perform additional crack detection steps, to improve the operation efficiency of crack detection.

In summary, a display panel, an electronic device and a crack detection method are provided according to the present disclosure. The display panel includes: a substrate and a detection signal line located on a side of the substrate, where the detection signal line is located in the non-display area, and includes a first detection signal line and a second detection signal line arranged in sequence in a first direction. That is, the display panel includes two detection signal lines. In this way, while detecting cracks, the first detection signal line and the second detection signal line may be used to detect cracks in different manners, alternatively, the first detection signal line and the second detection signal line may be used to detect cracks in the same manner, to improve the reliability of crack detection. In addition, in a case that it is not required to use both the first detection signal line and the second detection signal line for crack detection, one of the first and second detection signal lines may be selected for crack detection according to the actual situation, to improve the efficiency of crack detection.

In addition, in the display panel, the first detection signal line and the second detection signal line are arranged in the direction perpendicular to the substrate on one side of the substrate, and the orthographic projections of the first detection signal line and the second detection signal line on the substrate are at least partially overlapped, that is, the projections of the first detection signal line and the second detection signal line are partially overlapped, or completely overlapped. In this way, the horizontal space occupied by the crack detection circuit can be reduced, to reduce the space occupied by the crack detection circuit in the non-display area, i.e., the frame area, which is beneficial to reduce the size of the frame area of the display panel to realize a design with a narrow frame to be in line with the development trend of narrow frames.

Each embodiment in this specification is described in a progressive, parallel, or progressive and parallel manner. Each embodiment focuses on the differences from other embodiments. The same and similar parts between the various embodiments can refer to each other. As for the device disclosed in the embodiment, since it corresponds to the method disclosed in the embodiment, the description is relatively simple, and the related information can refer to the description of the method part.

It should be noted that, in the description of the present disclosure, it should be understood that the orientation or positional relationships indicated by the terms "upper", "lower", "top", "bottom", "inner" and "outer" are based on the orientation or positional relationship shown in the drawings, which are only for the convenience of describing the present disclosure and simplifying the description, rather than indicating or implying that the referred device or element must have a specific orientation, be constructed and operated in a specific orientation. Therefore, they cannot be understood as limitations to the present disclosure. When a component is considered to be "connected" to another component, it may be directly connected to another component or there may be an intermediate component at the same time.

It should be noted that, the relationship terms such as "first", "second" and the like are only used herein to distinguish one entity or operation from another, rather than to necessitate or imply that an actual relationship or order exists between the entities or operations. Furthermore, the terms such as "include", "comprise" or any other variants thereof means to be non-exclusive. Therefore, an article or a device including a series of elements include not only the disclosed elements but also other elements that are not clearly enumerated, or further include inherent elements of the article or the device. Unless expressively limited, the statement "including a . . . " does not exclude the case that other similar elements may exist in the article or the device other than enumerated elements.

What is claimed is:

1. A display panel, comprising:
   a substrate;
   a detection signal line located on a side of the substrate;
   a display area and a non-display area surrounding the display area, wherein the detection signal line is located in the non-display area, and comprises a first detection signal line and a second detection signal line arranged in sequence in a first direction;
   an inorganic layer, wherein the inorganic layer is located between a layer on which the first detection signal line is located and a layer on which the second detection signal line is located, the first detection signal line and the second detection signal line are at least partially overlapped in the first direction, and the first direction is perpendicular to a plane on which the substrate is located.
2. The display panel according to claim 1, wherein the display panel comprises a gate metal layer and a capacitor metal layer, and the capacitor metal layer is located on a side of the gate metal layer away from the substrate; and the first detection signal line is on a same layer as the gate metal layer, and the second detection signal line is on a same layer as the capacitor metal layer.
3. The display panel according to claim 1, wherein the first detection signal line comprises a first signal line and a second signal line respectively located on opposite sides of the display area;
   the second detection signal line comprises a third signal line and a fourth signal line respectively located on opposite sides of the display area;
   the detection signal line further comprises a fifth signal line, wherein the first signal line is electrically connected to the second signal line through the fifth signal line, and the third signal line is electrically connected to the fourth signal line through the fifth signal line; and
   the fifth signal line is on a same layer as the first detection signal line, or the fifth signal line is on a same layer as the second detection signal line.
4. The display panel according to claim 3, wherein the fifth signal line is on a same layer as the first detection signal line, and the fifth signal line is electrically connected to each of the third signal line and the fourth signal line through a via hole or a transistor.
5. The display panel according to claim 3, wherein the fifth signal line is on a same layer as the second detection signal line, and the fifth signal line is electrically connected to each of the first signal line and the second signal line through a via hole or a transistor.
6. The display panel according to claim 3, wherein a screen detection circuit is further provided in non-display area, the screen detection circuit is electrically connected to data lines in the display area, and the screen detection circuit is located at a side of the display area away from the fifth signal line;
   the second detection signal line is configured to provide a first switch control signal to control the screen detection circuit to provide a first screen detection signal to the data lines, or the second detection signal line is configured to provide a second screen detection signal to the screen detection circuit, and the screen detection circuit is configured to provide the second screen detection signal to the data lines based on a control of a second switch control signal.
7. The display panel according to claim 6, wherein the screen detection circuit comprises:
   a first detection circuit, wherein the first signal line is electrically connected to the first detection circuit through the third signal line, and the first detection circuit is electrically connected to a part of the data lines in the display area; and
   a second detection circuit, wherein the second signal line is electrically connected to the second detection circuit through the fourth signal line, and the second detection circuit is electrically connected to another part of the data lines in the display area.
8. The display panel according to claim 7, wherein each of the first detection circuit and second detection circuit comprises a control terminal, an input terminal and an output terminal, the output terminal is electrically connected to corresponding data lines, the input terminal is configured to receive the screen detection signal, and the control terminal is configured to receive the switch control signal;
   the third signal line is electrically connected to the control terminal of the first detection circuit, and the fourth signal line is electrically connected to the control terminal of the second detection circuit; or the third signal line is electrically connected to the input terminal of the first detection circuit, and the fourth signal line is electrically connected to the input terminal of the second detection circuit.

9. The display panel according to claim 1, wherein the first detection signal line is directly opposite to and is insulated from the second detection signal line in the first direction;
the first detection signal line has a first terminal and a second terminal, and the second detection signal line has a third terminal and a fourth terminal; and
wherein the first terminal and the second terminal are first resistance signal detection terminals; the third terminal and the fourth terminal are second resistance signal detection terminals; at least one of the first terminal and the second terminal is used as a capacitance detection terminal, and at least one of the third terminal and the fourth terminal is used as another capacitance detection terminal.

10. An electronic device comprising a display panel, wherein the display panel comprises:
a substrate;
a detection signal line located on a side of the substrate;
a display area and a non-display area surrounding the display area, wherein the detection signal line is located in the non-display area, and comprises a first detection signal line and a second detection signal line arranged in sequence in a first direction;
an inorganic layer, wherein the inorganic layer is located between a layer on which the first detection signal line is located and a layer on which the second detection signal line is located, the first detection signal line and the second detection signal line are at least partially overlapped in the first direction, and the first direction is perpendicular to a plane on which the substrate is located.

11. A crack detection method for a display panel, wherein the display panel comprises:
a substrate;
a detection signal line located on a side of the substrate;
a display area and a non-display area surrounding the display area, wherein the detection signal line is located in the non-display area, and comprises a first detection signal line and a second detection signal line arranged in sequence in a first direction; and
an inorganic layer, wherein the inorganic layer is located between a layer on which the first detection signal line is located and a layer on which the second detection signal line is located; and
wherein the first detection signal line and the second detection signal line are at least partially overlapped in the first direction, the first direction is perpendicular to a plane where the substrate is located; and
the crack detection method comprises:
providing an input signal to at least one of the first detection signal line and the second detection signal line to acquire a crack detection signal; and
determining whether there is a crack on the display panel according to the crack detection signal.

12. The crack detection method according to claim 11, wherein
the first detection signal line comprises a first signal line and a second signal line respectively located on opposite sides of the display area;
the second signal line comprises a third signal line and a fourth signal line respectively located on opposite sides of the display area;
the detection signal line further comprises a fifth signal line, wherein the first signal line is electrically connected to the second signal line through the fifth signal line; and the third signal line is electrically connected to the fourth signal line through the fifth signal line; the fifth signal line is on a same layer as the first detection signal line, or the fifth signal line is on a same layer as the second detection signal line; and
the providing an input signal to at least one of the first detection signal line and the second detection signal line to acquire a crack detection signal comprises:
providing a first input signal to the first detection signal line, and detecting a first impedance between two terminals of the first detection signal line, wherein the crack detection signal comprises the first impedance.

13. The crack detection method according to claim 12, wherein the display panel further comprises a screen detection circuit, the screen detection circuit is electrically connected to data lines in the display area, and is located on a side of the display area away from the fifth signal line, and the second detection signal line is electrically connected to the screen detection circuit; and
the providing an input signal to at least one of the first detection signal line and the second detection signal line to acquire a crack detection signal further comprises:
providing, based on determination that the first impedance indicates that the first detection signal line does not comprises a disconnection, a second input signal to the first detection signal line to provide a screen detection signal to the data lines, and acquiring a display screen of the display panel, wherein the second input signal comprises a switch control signal for an image detection circuit or the image detection signal, and the crack detection signal comprises the display screen.

14. The crack detection method according to claim 11, wherein the first detection signal line is directly opposite to and is insulated from the second detection signal line in the first direction; and
the providing an input signal to at least one of the first detection signal line and the second detection signal line to acquire a crack detection signal comprises:
providing a third input signal to the first detection signal line, and detecting a second impedance between two terminals of the first detection signal line, wherein the crack detection signal comprises the second impedance.

15. The crack detection method according to claim 14, wherein the providing an input signal to at least one of the first detection signal line and the second detection signal line to acquire a crack detection signal further comprises:
providing a fourth input signal to the second detection signal line, and detecting a third impedance between two terminals of the second detection signal line, wherein the crack detection signal comprises the third impedance.

16. The crack detection method according to claim 14, wherein the providing an input signal to at least one of the first detection signal line and the second detection signal line to acquire a crack detection signal further comprises:
providing a fifth input signal to one of the first detection signal line and the second detection signal line, and detecting a capacitance between the first detection signal line and the second detection signal line, wherein the crack detection signal comprises the capacitance.

17. The crack detection method according to claim 14, wherein the providing an input signal to at least one of the first detection signal line and the second detection signal line to acquire a crack detection signal further comprises:

providing a fourth input signal to the second detection signal line, and detecting a third impedance between two terminals of the second detection signal line, wherein the crack detection signal comprises the third impedance; and providing a fifth input signal to one of the first detection signal line and the second detection signal line, and detecting a capacitance between the first detection signal line and the second detection signal line, wherein the crack detection signal comprises the capacitance.

\* \* \* \* \*